(12) United States Patent
Hooley

(10) Patent No.: US 6,967,541 B2
(45) Date of Patent: Nov. 22, 2005

(54) DIGITAL PULSE-WIDTH-MODULATION GENERATOR

(75) Inventor: Anthony Hooley, Cambridge (GB)

(73) Assignee: 1 . . . Limited, Cambridgeshire (GB)

( * ) Notice: Subject to any disclaimer, the term of this patent is extended or adjusted under 35 U.S.C. 154(b) by 926 days.

(21) Appl. No.: 09/848,752

(22) Filed: May 2, 2001

(65) Prior Publication Data

US 2001/0043652 A1 Nov. 22, 2001

Related U.S. Application Data

(62) Division of application No. 08/930,361, filed on Sep. 30, 1997, now Pat. No. 6,373,955.

(30) Foreign Application Priority Data

Mar. 31, 1995 (GB) ............................................. 95/06725
Mar. 27, 1996 (WO) ............................... PCT/GB96/00736

(51) Int. Cl.$^7$ ................................................ H03K 7/08

(52) U.S. Cl. ..................................................... 332/109

(58) Field of Search .................. 332/109–111; 327/172, 327/175, 176; 375/238

(56) References Cited

U.S. PATENT DOCUMENTS

| | | | |
|---|---|---|---|
| 3,996,561 A | 12/1976 | Kowal et al. ............. | 340/172.5 |
| 4,330,691 A | 5/1982 | Gordon ...................... | 179/146 |
| 4,515,997 A | 5/1985 | Stinger et al. ............. | 381/116 |
| 4,773,096 A | 9/1988 | Kirn .......................... | 381/120 |
| 5,051,799 A | 9/1991 | Paul et al. .................. | 375/25 |
| 5,287,531 A | 2/1994 | Rogers, Jr. et al. ......... | 395/800 |
| 5,313,172 A | 5/1994 | Vagher ....................... | 330/254 |
| 5,313,300 A | 5/1994 | Rabile ........................ | 348/572 |
| 5,832,097 A | 11/1998 | Armstrong .................. | 381/106 |
| 6,294,905 B1 * | 9/2001 | Schwartz .................... | 323/288 |

FOREIGN PATENT DOCUMENTS

| | | |
|---|---|---|
| DE | 43 43 807 A1 | 6/1995 |
| GB | EPO 0 351 055 A1 | 1/1990 |
| JP | 7-7788 | 1/1995 |

* cited by examiner

Primary Examiner—David Mis
(74) Attorney, Agent, or Firm—Synnestvedt & Lechner LLP

(57) ABSTRACT

A digital pulse-width-modulation (PWM) generator comprising:

an n bit digital magnitude comparator having first and second n bit inputs and an output indicative of the relative values of the signals applied at the first and second inputs;

a first n bit digital up/down counter having a count direction input coupled to receive a sign bit of a digital unary input signal, an n bit parallel binary count output connected to the first n bit input of the magnitude comparator, and a clock input;

a second n bit counter having a clock input coupled to receive a constant rate clock signal and an n bit parallel binary count output connected to the second n bit input of the magnitude comparator;

an AND gate having a first input coupled to receive the constant rate clock signal in frequency divided form and a second input coupled to receive a magnitude portion of the digital unary input signal, and further having an output connected to the clock input of the first counter; and wherein the comparator continually generates an output signal indicative of the relative magnitudes of the counts of the first and second counters, whereby said output signal is a PWM output signal with an average value representing a ramp voltage having a slope determined by magnitude portion of the digital unary input signal with a direction of a slope of the output signal being determined by the polarity of the sign bit.

14 Claims, 14 Drawing Sheets

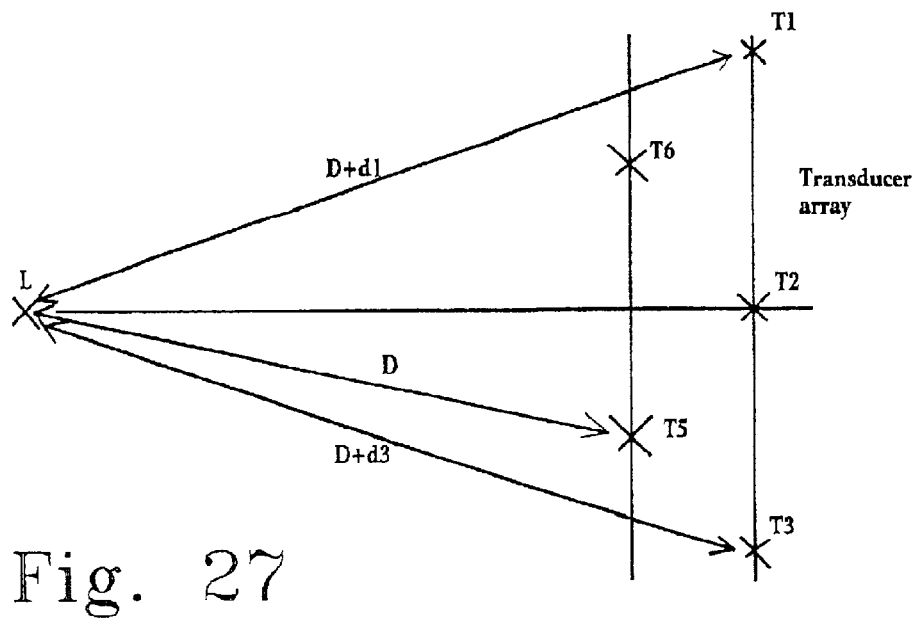
Fig. 27
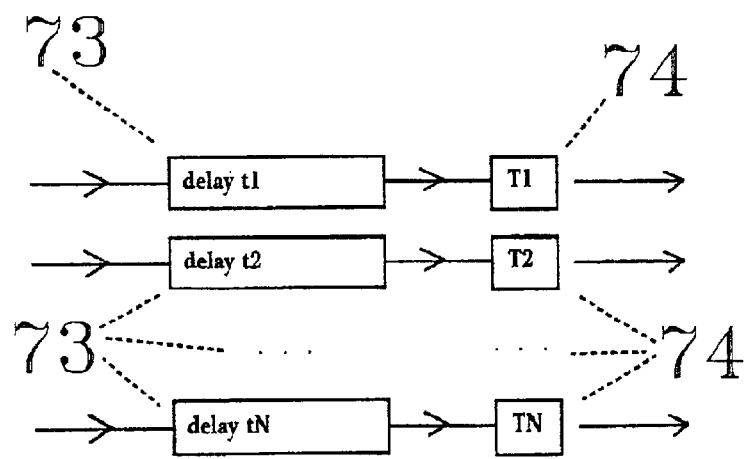
Fig. 28  digital delays

DIGITAL PULSE-WIDTH-MODULATION GENERATOR

RELATED APPLICATIONS

This application is a divisional of U.S. patent application Ser. No. 08/930,360, filed on Sep. 30, 1997, now U.S. Pat. No. 6,373,955, the disclosure of which is incorporated herein by reference.

TECHNICAL FIELD

This invention relates to a digital pulse-width-modulation generator which may be used in a loudspeaker for providing sound from electrical signals.

BACKGROUND & PRIOR ART

Conventional analogue loudspeakers rely for their operation on the motion of a diaphragm which is driven by some type of electromechanical motor, moving coil being the most common, though electrostatic, piezoelectric and ionisation devices have all been tried and used. The analogue loudspeaker as a whole attempts to reproduce the desired sound by moving all or part of the diaphragm closely in synchronism with a smoothly varying analogue electrical signal which is usually interpreted as representing the instantaneous sound pressure that a listener to the loudspeaker device should hear. The inherent limitations of such analogue loudspeakers are related to: the stiffness of the diaphragms used, the mass of the diaphragms, the linearity and efficiency of and power available from electromechanical motors with adequate bandwidth and limitations on the throw of the diaphragm. These and other factors combine to cause the analogue loudspeaker to operate with low efficiency and relatively high distortion levels.

With the current prevalence of high quality digital audio material available, frequently in 16-bit binary format with an inherent distortion level of close to 0.002%, it is clear that analogue hi-fidelity loudspeaker systems operating close to the 1% distortion level (500 times worse) are now the limiting factor in audio quality when listening to reproduced sound (including radio, television, compact discs (CD), and digital tape). Recent trends in electronic equipment have also been to minimise power consumption, not only to reduce power wastage, but also to reduce equipment operating temperatures thus allowing miniaturisation and high reliability, as well as portability, and allowing operation from small batteries. Again, the linear analogue power amplifier/loudspeaker combination operating at the 0.3% to 1% efficiency level is out of step with these trends. Lastly, even though digital audio source material is now commonplace and becoming increasingly so with the advent of digital radio and television, all conventional hi-fidelity systems for the reproduction of digital source material need to contain a digital to analogue converter (DAC) at some point in the system, to produce analogue signals for application to the analogue loudspeaker. The DACs themselves produce further noise and distortion that adds to that already present in the system, and also add extra cost.

Attempts have been made to develop a digital loudspeaker design that overcomes some or all of the limitations of analogue loudspeakers mentioned above. These fall into several categories: Pseudo-digital loudspeakers comprising a digital signal processor driving a standard analogue loudspeaker; Moving Coil Digital Loudspeakers with tapped "voice-coils"; and piezoelectric and electrostatic drivers, where the area of the diaphragm is divided into separate regions with binary-related areas Pulse-width-modulation (PWM) has also been used in the context of "digital loudspeakers". Here an analogue or digital input signal is converted into a two-level (binary in some sense) digital waveform whose instantaneous mark-space ratio is proportional to the instantaneous value of the input signal, with 50% mark-space ratio corresponding to zero input signal. The frequency of the PWM waveform may or may not be constant, but needs to be much higher than the highest input frequency, and for audio applications this implies it must in practice be greater than about 40 KHz. So long as that criterion is satisfied, the actual frequency is not critical. With a digital input signal, it is possible to produce a PWM waveform entirely digitally. However, when it comes to producing sound output, the PWM signal is applied to conventional linear transducers (e.g. moving coil loudspeakers). The result is that the inertia of the transducer causes it to respond to the average value of the PWM waveform (which instantaneously is the same as the mark-space ratio) which in turn is equal to the instantaneous value of the input signal. Sound is then produced corresponding to the input audio signal. As the device relies on the linearity of the transducer, this system has all of the disadvantages of analogue loudspeakers plus some extra ones related to the PWM conversion process, and so is really a digital amplifier technology, not a digital loudspeaker technology. It does have the virtue of higher efficiency than linear amplification.

Most previous attempts at building a digital loudspeaker system have assumed that binary digital code was the digital signal medium, not only at the input of the device but also right through to the output transducers. This causes serious technical problems in practice.

In an n-bit system, the transducer used for the least significant bit (LSB) of the output operates at a power level $2^{n-2}$ times less than the most significant bit (MSB) (discounting an assumed sign bit included in the n-bits). In an 8-bit system (the least that is useful for reasonable sound reproduction) there is thus a 64 times power ratio between MSB and LSB transducers. Because of the necessarily mechanical nature of sound producing devices (sound is a mechanical movement of air) this wide dynamic range imposes serious design constraints on the types of devices used for LSB and MSB transducers, and thus makes matching of the devices very difficult—the problems are much worse when one considers a more realistic 10 or 12 bit system where the ratios in power levels between the MSB and LSB transducers are then of the order of 250 to 1000 times, and for a 16-bit system the ratio rises to greater than 16000.

In a binary-weighted transducer (or transducer-array) system, there are serious transient problems caused at points where the code changes from a value with many consecutive low order zeroes or ones to the next level (up or down) where there are many consecutive low order ones or zeroes. For example, consider a 9-bit binary code where the signal level changes from (decimal) $255_{10}$=(binary) $011111111_2$ to (decimal) $256_{10}$=(binary) $100000000_2$. At this transition, the signal itself has changed by one least significant bit, i.e. a very small change. The binary code representation has changed from a zero plus all-ones code to a one-and-all-zeroes code. The effect of this on a system where the code bits each drive binary weighted transducers (and also binary weighted transducer-arrays as described in U.S. Pat. No. 4,515,997 which does not address this problem) is that in the first state all transducers except the most significant will be on, and in the second state all will be off except for the most-significant. Thus two half full-power acoustic transitions occur at this code point change which will inevitably produce considerable sound energy, even though the code change represents only a least significant bit change in signal amplitude which normally would be expected to be nearly inaudible. Other such ones-to-zeroes and zeroes-to-ones transitions occur throughout the signal amplitude range, and become more of a problem as the total number of bits increases, as the power of the transient increases relative to the system's least significant bit power level. Thus, increasing the resolution of the system by adding more bits makes the problem worse, not better.

In addition to the switching transient problem outlined above, there is also a level error associated with such zeroes-to-ones and ones-to-zeroes code changes. This is because in a real system the transducers cannot easily be matched precisely enough that the most significant bit transducer is precisely one least significant bit greater in effective power or amplitude than the sum of all the lesser-bit transducers acting in concert. The same is also true to a smaller extent for the next most significant bit transducer and its lesser-bit transducers acting in concert. Such unavoidable errors can in practice easily dominate the accuracy of the system and quite independently of the transient effects described above can lead to large distortion components. In a binary weighted transducer or transducer-array system (as described in U.S. Pat. No. 4,515,997 which does not address this problem either), only extreme mechanical precision can eliminate this problem even in principle, which will inevitably lead to high manufacturing costs even if the precision required is achievable. In practice, the transducers will necessarily be spatially separated and the matching problems at such transition points then become intractable. In a 16-bit system, compatible with current digital audio standards, it is highly unlikely that the necessary precision could be achieved at any cost.

Another problem not adequately addressed by existing digital loudspeaker designs is that of transducer dynamics and appropriate drive waveforms for producing the desired acoustic sound output waveform. All previous designs appear to make the assumption that the application of a square drive pulse (of voltage or current as appropriate) to the output transducers will produce a square acoustic output pulse. This is almost never the case in practice and leads to serious distortion in the generated acoustic waveform. For example, in the common case where the transducer moving mass is the dominant factor, and the principal forces to be overcome are inertial, then the application of a square drive pulse to such a transducer will produce approximately constant acceleration of the diaphragm which in turn will produce, to first approximation, a triangular or ramped acoustic output pulse, which will continue after the end of the input drive pulse at approximately constant amplitude as the diaphragm continues to "coast" due to its inertia. For the other common case where the diaphragm restoring spring forces are the dominant factor, then the application of a square drive pulse to such a transducer will produce a very rapid initial acceleration of the diaphragm causing it to move quickly to the point where the spring restoring force equals the driving force after which it will overshoot (depending on the damping of the system), and then settle around that point of equilibrium, after which the end of the drive pulse will produce a similar velocity profile in reverse. This motion will produce, to first approximation, a pair of narrow impulsive spike acoustic output pulses of opposite sign, separated by a time interval approximately equal to the input driving pulse length. Only in the case where the dominant forces on the moving mass of the transducer are resistive (e.g. due to friction or viscosity of the air being moved by the diaphragm) will its motion be of approximately constant velocity when driven by a square drive pulse, and only in this case will the output acoustic pulse be approximately of square pulse waveform. What this means in practice is that electrostatic transducers with exceptionally light diaphragms (which constitute the only moving mass in this type of transducer) are the only devices where a square drive pulse might be expected to produce an approximately square acoustic output pulse.

DEFINITION OF TERMS USED IN THE DESCRIPTION & CLAIMS

A digit is a single symbol representing a unique integer number. A decimal digit can take on any of the ten values 0, 1, 2, 3, . . . , 8, 9. Decimal integer positional notation uses the normal convention that digits within a decimal number represent factors times powers of ten, with the right hand digit representing a factor times $10^0=1$, the 2nd digit from the right a factor times $10^1=10$, the 3rd digit from the right a factor times $10^2=100$, etc. The value of the number represented by the decimal positional code is the sum of the factors times each of their respective powers of ten. So, e.g.

$$357_{10}=3\times10^2+5\times10^1+7\times10^0=300+50+7=357.$$

A binary digit can take on either of the two values 0, 1. Binary integer positional notation is similar to decimal integer positional notation except powers of two are used instead of powers of ten. Thus the 4th binary digit from the right in a binary positional integer represents a factor of 1 or 0 times $2^3$. So, e.g.

$$11010_2=1\times2^4+1\times2^3+0\times2^2+1\times2^1+0\times2^0=16_{10}+8_{10}+0+2_{10}+0=26_{10}$$

A unary digit can also take on any of the two values 0, 1 or alternatively can be defined to take on only the single value 1, and its absence is then used to represent 0 somewhat as in Roman Numeral notation. Unary integer positional notation is similar to binary or decimal positional notation except that integer powers of one are used instead of powers of 2 or 10. As all positive integer powers of 1 are equal to 1, it is clear that with a unary representation, all digits have equal weight, and that weight is unity and that the position of a unary digit in a unary positional notation number is irrelevant, only its value of 1 or 0, or alternatively, its presence or absence, having any significance. Thus the 4th unary digit from the right in a unary positional integer represents a factor of 1 or 0 times $1^3=1$, and the first unary digit at the right represents a factor of 1 or 0 times $1^0=1$. So, e.g.

$$11010_1=1\times1^4+1\times1^3+0\times1^2+1\times1^1+0\times1^0=1_{10}+1_{10}+0+1_{10}+0=3_{10},$$

which is just the number of 1-digits in the number. Thus digit position becomes irrelevant in unary numbers. It is for this reason that the 0 is not needed since its use as place-keeper in positional notations is irrelevant in the unary case. Thus we may just as precisely write the number $11010_1$ as $111_1$ with both representations having the decimal value $3_{10}$. Unary numbers are simply a formal name for the marks people frequently use for tallying when, e.g. counting items. It is important to realize that in unary representation it is the number of one-digits that matters, not the position of the one-digits. Note also that an unsigned N digit unary code can represent N+1 different values, because zero is represented by all the unary digits being 0 or absent and does not need an additional unary digit. A signed N digit unary code where one particular digit is reserved to represent the sign of the number (e.g. 0 for positive, 1 for negative) can represent 2N−1 values (i.e. 0 and ±1 to ±N−1). It follows, that where a digital signal is to be represented in unary code, that a unipolar signal that can take on N distinct levels can be represented by N−1 unary digits. This is to be compared with binary notation where N−1 binary digits are able to represent as many as $2^{N-1}$ distinct levels. Unary representation therefore requires many more digits than binary representation to represent a given range of values, just as binary representation requires many more digits than decimal representation to represent a given range of values.

Terminology: There is no special name for decimal digits. It is conventional to abbreviate the phrase binary digit to bit. Similarly, it is conventional to abbreviate unary digit to unit. However, as the word unit is easily confused in this unfamiliar role with its more conventional meaning, we use the phrase unary digit.

According to a first aspect of the present invention, there is provided a digital pulse width modulation generator for pulse width modulating a digital input signal comprising a single data bit and a sign bit, comprising:

an up/down digital counter (46), the up/down input counter (46) being controlled by the sign bit of the digital input signal;

an AND gate (45) having a first input which is clocked continuously by a first clock signal, a second input which receives the data bit of the digital input signal, and an output connected to the clock input of the up/down counter (46);

a second digital counter (42) clocked continuously by a constant rate, second clock signal;

a digital magnitude comparater (43) which compares the outputs of the two counters (42, 46) so that the greater-than or less-than output of the magnitude comparator (43) provides a pulse width modulation output signal, whereby the value represented by the pulse width modulation output signal is a ramp when the data bit of the digital input signal is at logic one and is a static value when the data bit of the digital input signal is at logic zero, the slope of the ramp being determined by the polarity of the sign bit of the digital input signal.

DISCLOSURE OF THE INVENTION

According to a second aspect of the present invention, there is provided a digital pulse-width modulation generator for pulse width modulating a digital input signal comprising a single data bit and a sign bit, comprising:

an n bit digital magnitude comparator having first and second n bit inputs and an output indicative of the relative values of the signals applied at the first and second inputs:

a first n bit digital up/down counter having a count direction input coupled to receive a sign bit of a digital unary input signal, an n bit parallel binary count output connected to the first n bit input of the magnitude comparator, and a clock input;

a second n bit counter having a clock input coupled to receive a constant rate clock signal and an n bit parallel binary count output connected to the second n bit input of the magnitude comparator;

an AND gate having a first input coupled to receive the constant rate clock signal in frequency divided form and a second input coupled to receive a magnitude portion of the digital unary input signal, and further having an output connected to the clock input of the first counter; and wherein the comparator continually generates an output signal indicative of the relative magnitudes of the counts of the first and second counters, whereby said output signal is a PWM output signal with an average value representing a ramp voltage having a slope determined by magnitude portion of the digital unary input signal with a direction of a slope of the output signal being determined by the polarity of the sign bit.

The digital pulse-width-modulation generator means may be employed as a pulse shaping means to control the shape of the driving waveform to a transducer in a loudspeaker comprising a plurality of substantially identical transducers each capable of converting an electrical signal into a sound wave, wherein the transducers are capable of being driven each independently of all the others by unary encoded signals representative of the sound to be produced by the loudspeaker.

According to another aspect of the invention a loudspeaker comprises a plurality of substantially identical transducers each capable of converting an electrical signal into a sound wave, wherein the transducers are capable of being driven each independently of all the others by unary encoded signals representative of the sound to be produced by the loudspeaker.

According to another aspect of the invention a loudspeaker comprises encoder means for converting an input signal into unary digital signals and a plurality of transducers each operative to convert a corresponding one of the unary digital signals into a sound pulse so that the cumulative effect of the transducers is to produce an output sound representative of the input signal.

According to another aspect of the invention a loudspeaker comprises encoder means for converting an input signal into unary digital signals and pulse shaper means for converting the standard unary digital signals into a variety of square and non-square profile pulse signals appropriate to the type of transducers used, the pulse-shape preferably being chosen such that the output acoustic pulse from the transducer when driven with said pulse-shape is approximately square in profile, and a plurality of transducers each operative to convert a corresponding one of the pulse-shaped unary signals into a sound pulse so that the cumulative effect of the transducers is to produce an output sound representative of the input signal.

The transducers are preferably identical and in a preferred embodiment each transducer is bipolar, being capable of producing positive and negative pressure changes dependent on the polarity significance of the unary signal applied.

In one preferred embodiment the transducers are arranged in a two-dimensional array, or a three dimensional array with gaps in between transducers to allow sound energy from all transducers to pass to the loudspeaker listening area. The shape of each transducer may be such that they tessellate in two dimensions, e.g. being triangular, square, rectangular or hexagonal. Gaps between the transducers may optionally be provided in this case. Alternatively the shape of each transducer may be such that the transducers do not tessellate, e.g. being circular or oval, gaps being provided between adjacent transducers. The presence of these gaps in a first array of transducers can be exploited by providing a further array of transducers behind the first array, each transducer in the second array being located behind a corresponding gap in the first array, making the arrangement three-dimensional. This process may be repeated to provide a composite transducer array with any number of layers.

As the transducer array is distributed in space, either in two or three dimensions, a listener will be distanced from the transducers by varying amounts, dependent on the position of any particular transducer in the array, with the effect that acoustic pulses emitted simultaneously by the transducers will arrive at the position of the listener at different times. This effect can be corrected by introducing a delay means for differentially delaying the input signals to the transducers in dependence upon their distance from the listener such that the acoustic pulses from all the transducers resulting from a single input signal change to the loudspeaker arrive at the position of the listener simultaneously. Further, the delay means may be adjustable to vary the delays applied dependent upon a chosen, and possibly varying, position of the listener.

Delay means may be provided between the loudspeaker input signal and each acoustic output transducer in order that the time of arrival of acoustic pulses from each transducer may be independently adjusted either statically or dynamically in order to optimise some one or more parameters of the loudspeaker behaviour, including the simultaneity of arrival at the position of a listener of correlated signals from the transducers.

According to another aspect of the invention a loudspeaker comprises a plurality of pairs, triplets or quadruplets of transducers arranged in a two or three dimensional array, each transducer of a pair, triplet or quad capable of converting an electrical signal into a sound wave, wherein the pairs, triplets or quads of transducers are capable of being driven each independently of all the other pairs, triplets or quads by unary encoded signals representative of the sound to be produced by the loudspeaker, with each of the transducers comprising a pair, triplet or quad of transducers being positioned in the array such that the position of the centre of gravity of each pair, triplet or quad taken as a whole lies as close as possible to the vertical or horizontal centre lines of the array, or both, and in the case of a three dimensional array as close as possible also to the front-to-back centre line of the array, in such a way as to localise the perceived sound from the loudspeaker to as small an area near the centre of the array as possible The previously described transducers may each be replaced by a pair triplet quadruplet or other multiple grouping all members of the group being connected to the same unary digital drive signal, and positioned physically such that the geometric centre of each multiple grouping of transducers is as close to a common point as possible, in such a way as to minimise the apparent spatial distribution of the sound source as perceived by a listener to the loudspeaker, symmetric placing arrangements of transducers in each multiple grouping being preferable.

The transducers or multiple groupings of transducers may be so connected to unary digital outputs such that transducers associated with adjacent input signal levels are physically adjacent or in close proximity in the two or three dimensional array layout, so as to minimise any apparent motion of the sound source as sound level changes.

The output sound produced by the array of transducers is the additive effect of the individual sounds produced by the individual transducers. No individual transducer reproduces the desired sound. In the case where the level of drive to each transducer is fixed, quieter sounds will be reproduced as a result of activation of a smaller number of transducers than louder sounds. The effect of encoding the input signal into a unary format is that an M out of N encoding is produced, where N is the number of distinct levels representable by the input signal and is also the maximum number of transducers required, and M is the instantaneous input signal level and is also the number of transducers activated by that input signal level. Unlike a binary coding (or any other higher order position-weighted coding system such as ternary, decimal etc.) a unary coding has the property that each individual unary digit represents the same identical value, i.e. one (arbitrary) unit, and it is solely the number of unary digits present or active that corresponds to the value of the number represented by any particular unary digital code word. Thus unary coding has the unique property amongst all digital codes, that all members of a particular subset of individual unary digits are always off, inactive or absent when the value represented by a code word is below some specific number and one or more of them are always on, active or present when the value represented by a code word is equal to or above that same specific number. The relevant feature of this property to digital loudspeakers is that using a unary encoding scheme at the output transducers completely eliminates the serious problems encountered when using a binary, ternary or higher-order digital representation scheme at the output transducers, which problems include the large transients produced when such higher-order codes traverse a value where a higher order transducer turns on or off and all lower order transducers turn off or on simultaneously. This is because in a unary encoding scheme it is not required that the effect of one transducer being turned on should partially cancel the effect of other transducers being simultaneously turned off. In fact, in any given (unipolar) transition whatsoever of input digital word value, unary transducers will either be turned on, or turned off, or neither, but never both at the same time. Thus their operation in the application to digital loudspeakers is free of such partial-cancellation transients. Other distinct advantages of the unary encoding scheme at the output transducers is that all transducers are required to be substantially identical and small variations between them will have little effect on the overall loudspeaker output signal level. Since it is the effect of the total number that are activated at any one time, that represents the input code word, a statistical averaging over their individual sensitivities occurs, ensuring that the precision of the array as a whole is better than the precision of the individual transducers. If the deviations of individual transducer sensitivities from a nominal value are randomly gaussianly distributed as would be expected, then a loudspeaker with N transducers would have a precision of $N^{-1/2}$ that of the individual transducers. E.g. if N=10,000 and the transducers are matched to within 5%, then the linearity of the loudspeaker as a whole, ignoring other effects, is approximately 0.05% at full scale, illustrating the potential of this technology to produce extremely high precision with easy to manufacture low precision components. Thus the unary encoding at the output transducers eliminates the problems associated with, e.g. binary weighted output transducers, where the transducer connected to the most significant bit has to be extremely precisely matched to all the lower-weighted transducers. By comparison with the example just given, a 13 bit binary weighted digital loudspeaker system is able to reproduce just over 8000 levels, and its most significant transducer must be matched to the sum of all the lower order transducers to better than 1 part in 4096 to produce output linearity better than 1 bit, requiring a precision of better than 0.02% in manufacturing which would be exceedingly difficult to produce in practice.

Because in a unary encoded digital loudspeaker system all transducers have the same, unit, output power level or 'weight', from the point of view of resultant sound output pressure, it does not matter which particular M transducers are turned on out of the total set of N transducers, to produce an output pressure level of M/N of the maximum available.

Thus a degree of flexibility is available in choosing subsets of transducers from the whole array which may be used to enhance performance in a variety of ways. Preferably, the transducers associated with similar input signal levels are physically adjacent in the array so that a reasonably localised sound source results, particularly at low amplitudes of reproduced sound.

According to one aspect of the invention, pairs of identical transducers may be connected directly in parallel, one such pair being connected to each of the unary encoded outputs of the driver circuits, and the transducers making up each such pair are mounted one on either side of the loudspeaker vertical centre line and equidistant from it on a horizontal line, so that their resultant effect is more closely similar to the effect that would have been achieved by locating the transducer pair on the vertical centre line. In this way, the undesirable horizontal spatial effect of a large array of transducers may be reduced. According to another aspect of the invention, pairs of identical transducers may be connected directly in parallel, one such pair being connected to each of the unary encoded outputs of the driver circuits, and the transducers making up each such pair are mounted one above and one below the loudspeaker horizontal centre line and equidistant from it on a vertical line, so that their resultant effect is more closely similar to the effect that would have been achieved by locating the transducer pair on the horizontal centre line. In this way, the undesirable vertical spatial effect of a large array of transducers may be reduced. According to a farther aspect of the invention, four identical transducers are connected in parallel to each of the unary encoded outputs of the driver circuits, and the transducers making up each such quadruplet are mounted at the corners of a rectangle whose centre is approximately coincident with the centre of the loudspeaker array, so that their resultant effect is more closely similar to the effect that would have been achieved by locating all four transducers very close to the centre of the array. In this way, the undesirable horizontal and vertical spatial effects of a large array of transducers may be reduced. The method may be extended to other numbers of grouped and parallelled transducers (e.g. triplets located at the vertices of equilateral triangles whose centres are approximately coincident with the centre of the loudspeaker array, quintuplets, sextets, etc.) This mechanism helps to localise the perceived source of sound for a listener because of the psychoacoustic effects in the ear and brain which cause a group of 2 or more similar pulses heard closely spaced in time to be perceived as a single pulse at the average time of arrival of the separate pulses. The effect of spacing pairs, triplets, quadruplets or greater numbers of transducers symmetrically about the centre of the array, all simultaneously activated by one of the unary driver signals, is to give the appearance to a listener that the source of the sound is very close to the centre of the array of transducers, independently of the actual location of the transducers in the parallelled grouping, so long as their joint centre of gravity (or centre of spatial symmetry) lies close to the centre of the array. This technique allows the construction of a large digital loudspeaker comprised of arrays of transducers where the spatial extent of the array is comparable to the distance of the listener from the loudspeaker, whilst still producing the illusion of being a spatially small sound source with a definite location, close to the centre of the array.

In order to reduce the acoustic emission of the loudspeaker in the frequency region above the limit of human hearing (ultrasonic emission) due to the pulsed nature of the outputs of individual transducers in the frequency range above the normal limits of human hearing, e.g. at frequencies greater than about 20 KHz, an acoustic low pass filter may be added between the output transducer array and the listening space. This may be implemented by the positioning of an appropriate quantity of material with high sound absorption in the region above 20 KHz and low sound absorption below that frequency, between the acoustic output transducers and the listening space. This is desirable since domestic animals are frequently sensitive to such high frequency acoustic emissions and may be alarmed or distressed by them.

A second approach to reduce such ultrasonic emission from the loudspeaker is to increase the digital sampling rate as much as possible. Standard digital audio material such as that available from compact discs and other common sources has a sampling rate in the 40 KHz to 50 KHz region. When reproducing a 20 KHz audio input signal with such a sampling rate, only two or three samples will occur within each cycle of the input signal. If the same sampling rate is carried through all the way to the acoustic output transducers, significant acoustic energy will be emitted below 100 KHz and smaller amounts at higher frequencies. If the sampling rate is raised to e.g. 100 KHz then the lowest strong supersonic emission will occur at a significantly higher frequency and its amplitude will be proportionately less than that of the components previously present. A method of raising the effective sampling rate is to digitally interpolate the input signal to the loudspeaker. Such a process is already done in digital signal processing systems including for example the digital to analogue converters used in the better quality Compact Disc players, principally to ease the electrical filtering requirements after the conversion to analogue electrical signals. Here a similar interpolation process is used to ease the acoustic filtering requirements after digital to analogue sound conversion.

An analogue to digital converter may be incorporated to allow analogue input signals to be applied to and reproduced through the loudspeaker.

The encoder means may have a plurality of parallel outputs corresponding to the number of unary signals and the number of transducers. An alternative arrangement is for the unary signals to be compressed in time and for the encoder to have fewer outputs, in the limit a single output, means then being provided to reconstitute the unary signals as a parallel stream for application to the transducers.

Preferably, the loudspeaker assembly according to the invention includes transducer drivers connected between the encoder means and the transducers, the transducer drivers converting the unary output signals from the encoder means to appropriate current and voltage levels to drive the transducers.

According to the dynamics of the transducers to be driven from the unary output signals from the encoder means, possibly via transducer drivers, there may additionally be pulse shaping means controlling the shape of the driving waveform to the transducers, and in particular the pulse shaping means may provide driving pulses deviating from the nominal square shape of a standard digital pulse. The pulse shaping means may allow the electrical drive pulse shape to each transducer compensates for its electroacoustic transfer function in such a way as to optimise the pulse shape of its acoustic output pulse, such pulse shaping means including but not being restricted to producing linear ramps, square pulses, bipolar impulse pairs and linear combinations thereof, for the compensation of restoring-force dominated, resistance dominated and mass dominated transducers. Where the transducers are such that over the range of speeds of operation appropriate to use as elements of a digital loudspeaker their dynamics are dominated by resistive or viscous drag forces, then a square drive pulse will provide approximately constant velocity operation while the pulse is on and thus approximately constant pulse output pressure will result. Where the transducer dynamics are such that spring-like restoring forces (compliance) dominate, generally the case with transducers operating below their resonant frequencies and with low damping, then the pulse shaping means may provide linear ramp shaped driving pulses which then also result in constant velocity operation for the duration of the input pulse and approximately constant pulse output pressure. Where the transducer dynamics are such that inertial forces dominate, generally the case with transducers operating above their resonant frequencies and with low damping, then the pulse shaping means may provide bipolar impulse shaped driving pulses comprising a short pulse coincident with the leading edge of the input pulse and a second short pulse of reverse polarity coincident with the trailing edge of the input pulse, which then also results in essentially constant velocity operation for the duration of the input pulse (because the initial impulse from the pulse shaper gives the transducer moving parts some initial momentum after which they effectively "coast" for the duration of the input pulse at constant velocity until the reverse impulse from the pulse shaper removes the momentum at the end of the input pulse) and approximately constant pulse output pressure. Where the dynamics of the transducers are composites of these three cases the pulse shaping means may provide a driving pulse waveform such as to produce essentially constant pulse output pressure for the duration of each input pulse. The pulse shaping means may in all cases cited above be combined directly with the transducer driving means into a composite structure. Alternatively, the pulse shaping means may be interposed between the encoder means and the transducer driver means. Another alternative is to interpose the pulse shaping means between the transducer driver means and the transducers.

In order to preserve the generally high power efficiency of digital pulse drive electronics when producing square drive pulses, the pulse shaping means may be implemented using pulse width modulation techniques (PWM) wherein the effective shape of the drive pulse to the transducer is the mean value of a rapidly changing square waveform with many cycles occurring within the duration of one unary input pulse and whose mark-space ratio is varied continuously as required in order to produce the desired effective pulse shape suited to the transducer dynamics. In particular the pulse shaping means may be a digital PWM generator in accordance with the present invention.

The encoding means may have grouping means for dividing n input binary digits or bits (if the input were binary) into k groups of n/k bits and may then have a plurality of encoders corresponding in number to k each with n/k input bits, and each with a much reduced number of logic gates, the transducer drivers then having some additional gating.

The encoding means for producing N unary signals from n input binary (e.g.) bits, where $N=2^n-1$ or if one of the n input bits is used as a sign bit then $N=2^{n-1}-1$, may be built in a modular fashion so that a number of identical encoding sub-modules may be connected to a data bus carrying the complete input binary (e.g.) data words representing the electrical input signal to be reproduced as sound. The encoding sub-modules, which are each designed to encode P unary digits where P<N and where usually there would be Q such modules such that P×Q=N, may be pre-programmed before activation as encoders by sending to them control signals via a control bus and programming data via the data bus or the control bus such that each of the Q sub-modules after programming is responsive to a different group of P input signal levels and encodes just that group of P input signal levels into P unary output signals. The nett effect is to encode all N possible input signal levels into P×Q=N unary output signals but without the complexity of a brute-force n-bit binary (e.g.) to unary encoder, instead using Q identical modules which are easier to design and mass produce, and also easier to expand to different numbers of input signal bits n. The programming system may be made extremely simple by arranging for each of the Q encoder sub-modules to contain a flip-flop, and arranging for the control-bus connection between the modules to interconnect the Q flip-flops so as to form a serial input shift register. At programming time a single pulse is introduced to the input of the shift-register so formed and which shift register is physically distributed amongst all Q encoder sub-modules, and which is then clocked via a common clock signal present on the control bus, through the shift register one flip-flop at a time. As only one pulse is introduced into the input of the flip-flop during programming, only one module can contain the pulse after each clock pulse has moved it to the next stage, and therefore if the flip-flop in each module is used to activate that module for programming if and only if it contains the shifted pulse, each module may be programmed uniquely in turn by introducing programming information onto the common data bus for example, and issuing a programming pulse onto the control bus common to all modules whereupon only the module containing the shifted pulse in its flip-flop will respond to that programming instruction. Thus by shifting the pulse through the Q modules one module at a time by means of the clock signal and issuing programming information after each such shift operation, the entire chain of modules may be programmed each with information specific to that module, even though the modules are logically identical and have no unique address as such. This module programming technique is widely applicable to any programmable modular structure connected to a common bus and is not restricted in its use to the digital loudspeaker design presented here.

The encoding means for converting digital input in one form, e.g. binary, to unary digital output, may be simplified where the input form represents a signed quantity, by taking the sign information outside of the encoding scheme and using it together with the encoder outputs to control the transducer drivers or pulse shaping means directly to control the sign of the output signals. In the case of a binary to unary encoder with n input bits, where one of the input bits is a sign-bit, if the other n−1 bits are fed to an unsigned n−1 bit binary to unary encoder and the $2^{n-1}-1$ unary digital output signals are fed to the transducer drivers together with the input binary sign-bit, a considerable saving in circuitry results with no loss of information.

According to a further aspect of the invention there is produced an encoder means for converting a digital input signal comprised of n input digits into a plurality of unary signals having grouping means for dividing n input digits into k groups of n/k input digits each group connected to a separate encoding means capable of encoding n/k input digits into unary signals, with the output signals from the k separate encoding means combined using digital logic to produce the requisite total number of unary output digital signals, in this manner reducing the total number of simple logic gates required to implement the encoder means.

According to a further aspect of the present invention, there is provided an encoder means for converting a digital input signal comprised of n input digits into a plurality of unary signals, built in a modular manner from a number k of identical sub-encoders each capable of encoding n/k input digits all connected to a common input signal and control bus and programmable so as each to respond to and encode to unary a certain unique range of input digital signals so as to encode the entire n input digits of the input signal when all acting in concert.

According to a further aspect of the present invention, there is provided a structure capable of allowing a number of identical modules all connected to a common bus wherein certain line or lines of the bus are daisy chained through the modules and where a bus controller means is situated at one end of the bus structure, and where flip-flops incorporated for the purpose in each module are so interconnected by the common and daisy chained bus structures as to effectively form a serial input shift register with the bus controller situated at the input end of the shift register so formed, and wherein a single pulse from the bus controller may be shifted through the modules in sequence and one at a time by means of a common clock signal impressed on the bus by the bus controller and readable by all modules, and wherein the modules are so constructed such that when the pulse in the shift register is within a module that module will respond to programming signals available to it on the bus from the bus controller logic and not otherwise, and in this way the bus controller may provide unique programming information to each and every module on the bus notwithstanding the fact that the modules are logically identical and contain no unique hard-wired or pre-programmed unique address information, thus allowing completely standard unprogrammed modules to be added to the bus and yet be uniquely programmable and thereby distinguishable in function, and wherein an additional bus control signal may be connected only to the last module connected to the end of the bus that is furthest from the bus controller in such a way as to signal to the bus controller that the single pulse inserted into the previously mentioned shift register has reached the last module on the bus in this way allowing the bus controller to determine the number of identical modules connected to the bus simply by counting the number of shift register clock pulses issued.

The loudspeaker assembly may have interpolating means for interpolating the digital input signals to increase the effective sampling rate and thereby reduce spurious high frequency outputs from the transducers.

Advantageously the loudspeaker incorporates meanamplitude control of the acoustic output pulses from the transducers by gating them on and off with a high frequency digital waveform in addition to any unary and pulse-shaping modulation already present and in this way providing an effective volume control for the whole loudspeaker without reducing the effective number of transducers in use and thus preserving the resolution of the loudspeaker and thus not raising its internally generated signal to quantisation noise level, and without lowering the electrical drive efficiency of the transducers.

Desirably the mean-amplitude control mechanism described is automatically controlled so as to raise the mean-amplitude when the loudspeaker is reproducing louder sounds and lower the mean-amplitude when reproducing less loud sounds in such a way as to always maximize the number of transducers that may be driven subject to the total output amplitude corresponding as closely as possible to the required output amplitude, and thus to maintain high resolution over a wide dynamic range without necessarily providing as many separate output transducers as there are distinct levels in the digital input signal.

The effective amplitude of the acoustic output pulses emitted by the unary output transducers may be adjusted whilst still maintaining high efficiency by gating them on and off with a high frequency signal superimposed on top of the drive signals from the unary encoder outputs and any pulse shaping circuitry, in a logical AND manner, where the mark space ratio of the high frequency signal is continuously variable from 0 to 1. This is similar to pulse width modulation but is an additional modulation to that already produced by the loudspeaker circuitry. An alternative or possibly additional way of altering the effective amplitude of emitted acoustic output pulse from the transducers is to pulse width modulate the power supply to the transducer driver circuitry which again may be done with high efficiency. Both of these techniques allow a volume control function to be incorporated into the loudspeaker whilst maintaining the highest possible signal to noise ratio as the effective attenuation of the volume control occurs right at the output end of the loudspeaker system and thus attenuates any internally generated noise equally with the signal.

The method described in the preceding paragraph may be used to reduce the number of transducers required for a unary digital loudspeaker without reducing the effective resolution of the sound output. This is preferably achieved by the incorporation in the loudspeaker assembly of power control means such as described in the previous paragraph which dynamically vary the output power of each transducer in dependence upon the amplitude of the input signal. The power control means may include a digital delay device capable of storing, at full input signal resolution of n bits (e.g. if the input signal is encoded in binary), at least one half cycle of the input signal at its lowest frequency, storage means for storing the maximum amplitude attained by the input signal in the time duration for which the input signal is stored in the delay device, means for selecting the p most significant consecutive input signal bits (p<=n) containing a 1 and not a 0 in the most significant bit position of that group of p bits and discounting the sign bit, for transfer to the unary encoder, and means for selecting the output power level of the transducers in dependence upon the maximum amplitude attained in the storage means, the selected power level prevailing whilst the stored input signal is read out of the digital delay device. In this manner, a digital loudspeaker capable of encoding <=p bits into unary encoded signals driving $2^p$ output transducers is able to produce a dynamic range of n bits (p<=n) whilst avoiding the extra complexity of providing the additional circuitry and transducers required by an n bit unary encoder and output system.

In order to allow analogue signal sources as well as digital signal sources to be reproduced through the digital loudspeaker that is the subject of this invention, an analogue to digital converter may additionally be incorporated into the loudspeaker assembly to facilitate this function.

Because all the transducers have unit weight (i.e. they are identical and not related in a 1:2:4:8:16 etc relationship), the relative error of each one is the same, and even a 50% error in the sensitivity of one of the transducers would produce only a half least-significant-bit error referred to the binary input signal.

Because unary code has no sequential all-ones to all-zeroes adjacent code changes (unlike binary for example, as is illustrated by when it changes from $255_{10}=011111111_2$ to $256_{10}=100000000_2$) there are no transients in a unary based digital loudspeaker associated with such digital pattern changes.

Because the transducers are all identical and each has unit weight (i.e. has only to produce the output required for the smallest incremental change in output (i.e. 1 bit)) they are low power devices, cheap and easy to make and edge effects are irrelevant as they are identical for each transducer, which is all that is required.

Because the transducers all handle exactly the same power level there are no engineering problems associated with matching devices operating at vastly different power levels.

Each transducer turns on and off at most once during each cycle of a sinusoidal audio output waveform independent of the digital sampling rate, so the output transducers are not required to have bandwidth significantly greater than the bandwidth of the audio signals to be reproduced.

The performance required of the transducers is independent of the resolution (number of bits) required of the digital loudspeaker—one simply needs to add more identical units for higher resolution.

The unary digital loudspeaker system works because the pressure generated by M transducers being turned on is M times the pressure generated by one transducer being turned on. As M transducers are turned on when the input digital code represents the number M then the output sound pressure is a faithful reproduction of the input signal. Because binary (or higher order encoding) is not used at the output transducers, a unary encoded loudspeaker is not subject to any of the distortion generating problems previously described here resulting from binary or higher encoding at the output transducers.

Because sound is a longitudinal wave and can require both increases and decreases in pressure, it is in practice preferable to provide both positive and negative pressure changes. These can be produced with separate positive and negative pressure transducers, or with the same transducers driven in a bipolar manner. To reproduce silence, all transducers are turned off. To produce a positive pressure the front face of the transducers is made to move outwards relative to the off-state. To produce a negative pressure the front face of the transducers is made to move inwards relative to the off state. If separate unary digit signals from the output of the binary to unary decoder represent positive and negative pressures, it is possible to either apply these signals to separate positive-pressure and negative-pressure producing transducers, or to drive individual transducers in a push-pull or bipolar manner, with a pair of unary signals driving each one. The latter scheme reduces the number of individual transducers required for a digital loudspeaker of a given resolution by a factor of two. Alternatively, the sign bit of a binary input signal may be omitted from the binary to unary encoder and separately used to control the polarity of pressure pulses from the acoustic transducers driven by the (positive) unary outputs of the encoder. This scheme also reduces the number of transducers required for a digital loudspeaker of a given resolution by a factor of two.

A practical digital loudspeaker of this type will require a large number of transducers. E.g. to handle an 8-bit binary input, requires the representation of 256 sound pressure levels. As level 0 requires no pressure, no transducer is required for this level. Therefore, 255 transducers (maximum) are required in this example. If the transducers are driven in a bipolar manner, either, each by a pair of unary digital signals representing a positive and negative unit step of pressure, or, by a sign control bit and unipolar unary digital signals, then 128 transducers will suffice. In general, for a system handling n-bit binary input, either $2^n-1$ or $2^{n-1}$ transducers are required, depending on whether advantage is taken of the bipolar driving scheme described above. Whilst it is possible to use discrete transducers for this purpose, it is possibly advantageous to use integrated multiple transducers to reduce cost and manufacturing complexity. For example, if electrostatic transducers were to be used, it would be possible to produce a large number of electrodes of equal area, each with a separate connection to separate unary digital signals, on one physical transducing device, thus producing a transducer array. If piezo-electric transducers were to be used, then one piece of piezo-electric material could be divided up into a large number of equal area regions each with its own electrodes for separate connection to distinct unary digital signals, again resulting in a transducer array. Similarly, with an electromagnetic transducer, a set of separately connected wires each producing identical ampere-turn effects within the magnetic field of the device, and individually connected to distinct unary digital signals, would again result in a transducer array. All of these array structures could additionally be operated in a bipolar or push-pull fashion so that each transducer element of the array had separate connections to two distinct unary digital signals or a unary digital signal and a sign control bit for producing positive and negative output pressures. All such array structures have the great advantage of requiring multiple identical elements which assists with matching and simpler manufacture.

BRIEF DESCRIPTION OF DRAWINGS

FIG. 27 illustrates the different path lengths between a listener and the various transducers in an array of transducers.

FIG. 28 illustrates a method of applying differential signal delays to each transducer in an array in order to compensate for differential listener-to-transducer path lengths.

BEST MODE FOR CARRYING OUT THE INVENTION

Figure 1:
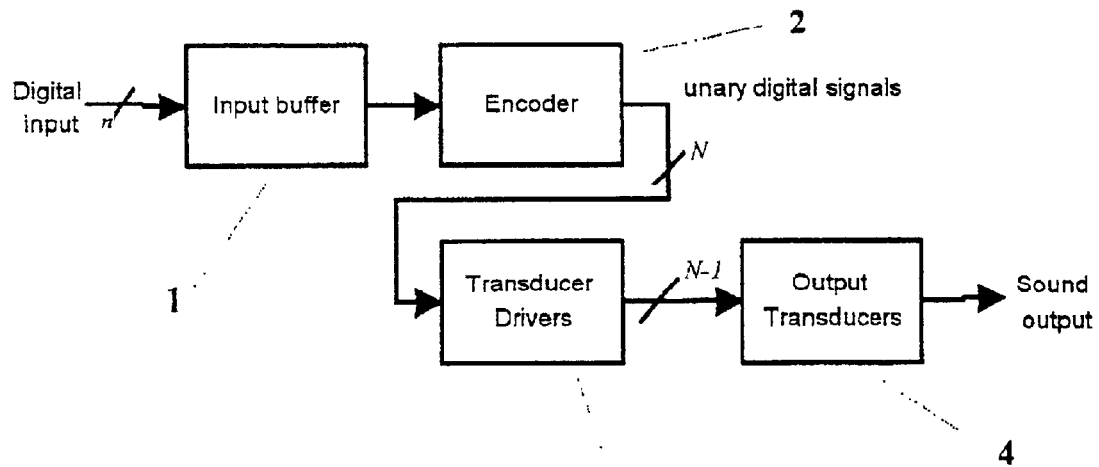
FIG. 1 is a block diagram illustrating the relationship between the various basic components of a digital loudspeaker.

FIG. 1 illustrates a digital loudspeaker in which the present invention may be applied. A digital input signal of some kind representing a sound pressure waveform is received by the apparatus at the input buffer 1 on n input signal paths. This digital signal may be in any digital code form (e.g. binary code, decimal code, in serial or parallel format). For the purposes of explanation only we assume a binary code input signal of n bits, where one of the bits is a sign bit indicating the polarity of the input signal though the invention is not in any way limited to this input format. The input buffer 1 presents a uniform impedance to the input signal(s) and performs any necessary level conversion and/or serial to parallel conversion before presenting the n parallel binary bits to the encoder 2. The encoder 2 encodes the n bit binary input code into N unary signals, one of which is a unary sign or polarity signal indicating whether the remaining N−1 unary signals represent a positive or negative quantity, and where $N=2^{n-1}$, and where the principal function of the encoding is that when the (positive) magnitude of the n-bit input signal is equal to M then M of the N−1 non-sign unary signals will be turned on (i.e. logic one) and the remainder turned off (i.e. logic 0). The N output signals including the sign signal from the encoder 2 are applied to the transducer drivers 3 which convert the N unary signals from the encoder 2 into N−1 sets of signals of appropriate current, voltage, pulse shape and polarity to separately drive N−1 acoustic output transducers shown collectively in FIG. 1 at 4 to which the transducer drivers 3 are connected. The N−1 sets of signals may be each a single bipolar signal with all N−1 transducers sharing a common return (not shown), or alternatively, may each be a pair of push-pull signals. The set of N−1 acoustic output transducers 4 each of which is substantially identical to the others convert the electrical drive signals into uniform acoustic pulses each of amplitude a and polarity as indicated by the input sign bit. As the action of the encoder 2 is to activate M of the N−1 non-sign unary signals when the digital input signal has magnitude M, each of which results in an acoustic pulse of amplitude a being emitted, the total emitted amplitude from the array of transducers is M×a=A. Thus the total acoustic output pressure from the system illustrated in FIG. 1 has the same polarity as the input signal and amplitude M×a when the digital input signal has magnitude M, and thus faithfully reproduces as sound the digital electrical input signal albeit with some quantisation noise dependent on the number of transducers N−1.

The input buffer 1 is straightforward and will not be described further. The unary digital encoder 2 may be implemented in any of the standard ways familiar to those versed in the art of digital electronics, including suitably connected gates, programmable logic devices and read-only memory look up tables. The definition of the decoding function to be implemented will be illustrated for the case of an n-bit signed binary input. The encoder 2 will then have n binary inputs $b_0, b_1, b_2, \ldots b_{n-1}$, and N outputs $u_0, u_1, u_2, \ldots u_{N-1}$, where $N=2^{N-1}$. The output $u_0$ will be the unary output sign signal indicating whether the unary output number whose magnitude is encoded in the remaining N−1 outputs is to be interpreted as positive or negative. It is defined as: $u_0=b_{n-1}$, where binary input $b_{n-1}$ is the sign-bit of the input signal. The remaining n−1 binary input $b_0, b_1, b_2, \ldots b_{n-2}$ represent an unsigned binary number whose magnitude V may range between 0 and $2^{n-1-N}-1$. The remaining N−1 unary outputs $u_1, u_2, \ldots u_{N-1}$, are defined as:

$$u_i=0 \text{ if } V<i, \text{ otherwise } u_i=1, \text{ for } 0<i<N$$

Thus if V=0 (which is <1) then all of the unary outputs are zero. Otherwise, there are V unary outputs with value 1 when the input binary magnitude=V, where 0<V<N.

Figure 2:
FIG. 2 illustrates simple logic for a unipolar 1-bit binary to unary converter.
Figure 3:
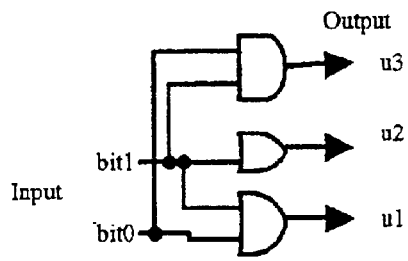
FIG. 3 illustrates simple logic for a unipolar 2-bit binary to unary converter.
Figure 4:
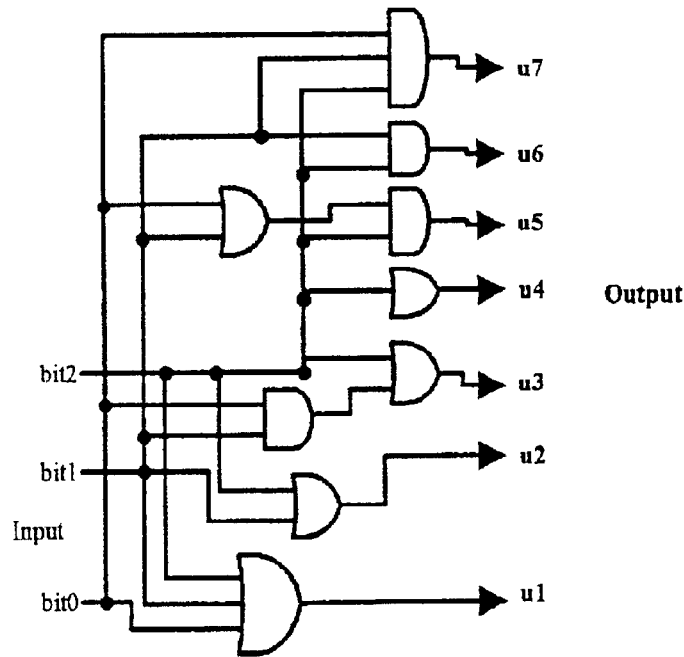
FIG. 4 illustrates simple logic for a unipolar 3-bit binary to unary converter.

Thus the sign bit is trivially passed from input bit $b_{n-1}$ straight through to output unary sign bit $u_0$. The remaining circuitry essentially implements an n−1 bit unipolar binary to unary encoder. FIG. 2 illustrates a trivial 1-bit unipolar binary to unary encoder, while FIG. 3 illustrates a 2-bit version and FIG. 4 a 3-bit version of unipolar binary to unary encoders.

Figure 5:
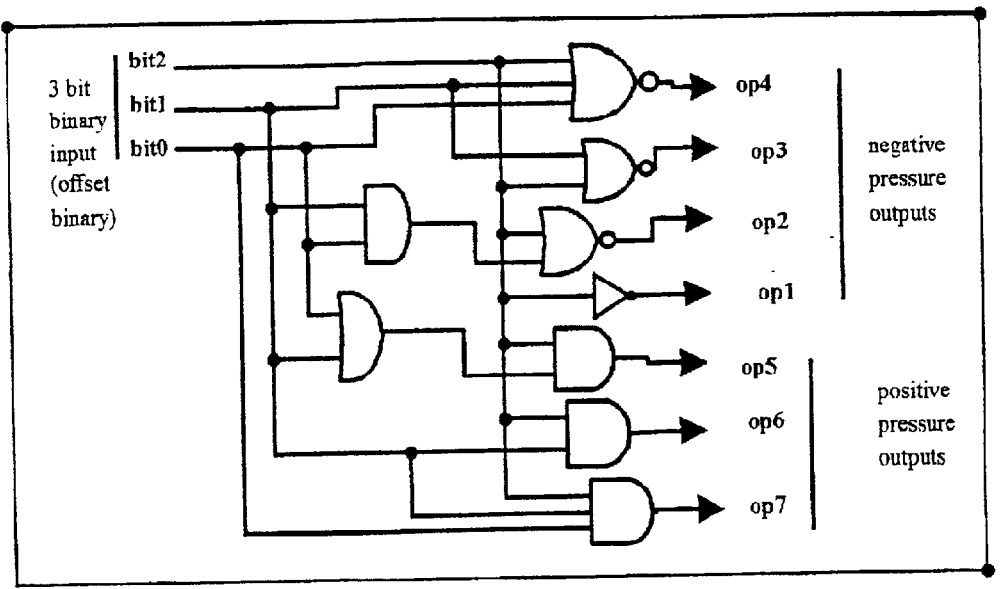
FIG. 5 illustrates simple logic for a 3-bit offset binary to unary converter.

FIG. 5 illustrates a 3-bit offset binary to unary encoder 5. In this case there is no input sign-bit as such. Instead, when the binary code is interpreted as a bipolar signal (offset binary code), one has to define the code representing zero output sound pressure. For a 3-bit offset binary system this is usually taken as code $011_2$ or $100_2$. The table below shows how this would be encoded into unary signals, some representing positive pressure outputs and some negative pressure outputs, where we have assumed code $100_2$ represents zero. The decimal value of the analogue input value represented is also shown in the column labelled i/p:

| | decimal binary | | | negative outputs | | | positive outputs | | | |
|---|---|---|---|---|---|---|---|---|---|---|
| | | bit | | | | | | | | |
| i/p | bit 2 | 1 | bit 0 | op1 | op2 | op3 | op4 | op5 | op6 | op7 |
| −4 | 0 | 0 | 0 | 1 | 1 | 1 | 1 | 0 | 0 | 0 |
| −3 | 0 | 0 | 1 | 1 | 1 | 1 | 0 | 0 | 0 | 0 |
| −2 | 0 | 1 | 0 | 1 | 1 | 0 | 0 | 0 | 0 | 0 |
| −1 | 0 | 1 | 1 | 1 | 0 | 0 | 0 | 0 | 0 | 0 |
| 0 | 1 | 0 | 0 | 0 | 0 | 0 | 0 | 0 | 0 | 0 |
| 1 | 1 | 0 | 1 | 0 | 0 | 0 | 0 | 1 | 0 | 0 |
| 2 | 1 | 1 | 0 | 0 | 0 | 0 | 0 | 1 | 1 | 0 |
| 3 | 1 | 1 | 1 | 0 | 0 | 0 | 0 | 1 | 1 | 1 |

In this truth table, i/p is given in decimal and represents a bipolar input signal level, and bits 0 to 2 are the same thing in binary. The unary digit outputs op1 to op4 will be used to drive negative pressure transducers, whilst unary digit outputs op5 to op7 will be used to drive positive pressure transducers. As can be seen from the truth table, none of the negative pressure outputs op1 to op4 are on (value 1) when any of the positive pressure outputs op5 to op7 are on (value 1). Thus if, for example, op1 was paired with op5, op2 with op6, and op3 with op7, each pair driving the opposite sides of a bipolar pressure transducer, then it will be seen that the transducers will properly produce positive or negative pressure steps according to the code in the table, without mutual interference between the positive and negative outputs. I.e. any one transducer will never be driven by a positive and a negative signal of value=1 simultaneously. Thus the number of transducers required may be approximately halved with respect to the case where each of the unary outputs is used to drive a separate transducer.

Figure 6:
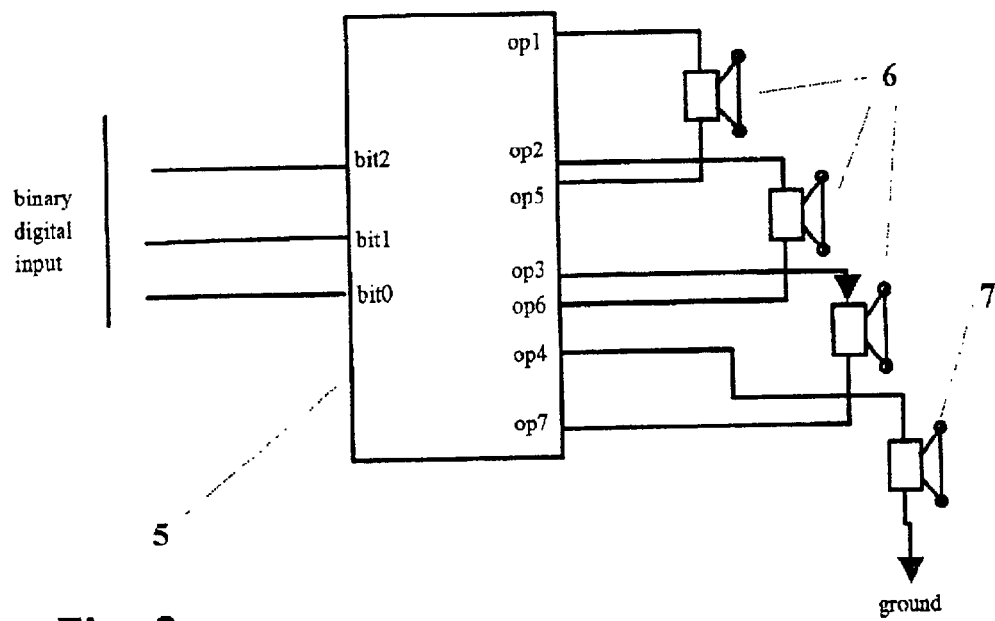
FIG. 6 illustrates a method of push-pull (bipolar) driving of transducers by pairs of unary signals of opposite polarity significance.

In FIG. 6 may be seen how pairs of outputs from the encoder 5 can be applied to acoustic transducers 6 to provide bipolar drive and thus bipolar pressure wave outputs. As described above, op1 is paired with op5 to drive one transducer, and op2 & op6, and op3 & op7 are similarly paired. op4 can either be used for unipolar drive of an additional transducer 7, or simply not used at all, as no matching positive output signal is available to pair it with. This will always be the case when deriving unary outputs from binary inputs because binary codes necessarily represent an even number of levels (all powers of two), one of which will be used to represent zero, leaving an odd number which cannot be shared evenly between positive and negative levels. So in general, with n-bit offset binary input, $2^n-1$ unary digital outputs will be derived by the encoder, and one of these will be un-pairable, leaving $2^n-2$ unary signals. These will then be arranged into $2^{n-1}-1$ pairs and applied to the same number of audio transducers, possibly via some transducer driving circuitry.

An alternative to offset-binary is twos-complement binary (commonly used in modem digital computers for the representation of signed integers because of the ease of doing arithmetic with this code). The truth table for a twos-complement to unary bipolar encoder is shown below:

| i/p | bit 2 | bit 1 | bit 0 | op1 | op2 | op3 | op4 | op5 | op6 | op7 |
|---|---|---|---|---|---|---|---|---|---|---|
| −4 | 1 | 0 | 0 | 1 | 1 | 1 | 1 | 0 | 0 | 0 |
| −3 | 1 | 0 | 1 | 1 | 1 | 1 | 0 | 0 | 0 | 0 |
| −2 | 1 | 1 | 0 | 1 | 1 | 0 | 0 | 0 | 0 | 0 |
| −1 | 1 | 1 | 1 | 1 | 0 | 0 | 0 | 0 | 0 | 0 |
| 0 | 0 | 0 | 0 | 0 | 0 | 0 | 0 | 0 | 0 | 0 |
| 1 | 0 | 0 | 1 | 0 | 0 | 0 | 0 | 1 | 0 | 0 |
| 2 | 0 | 1 | 0 | 0 | 0 | 0 | 0 | 1 | 1 | 0 |
| 3 | 0 | 1 | 1 | 0 | 0 | 0 | 0 | 1 | 1 | 1 |

Figure 7:
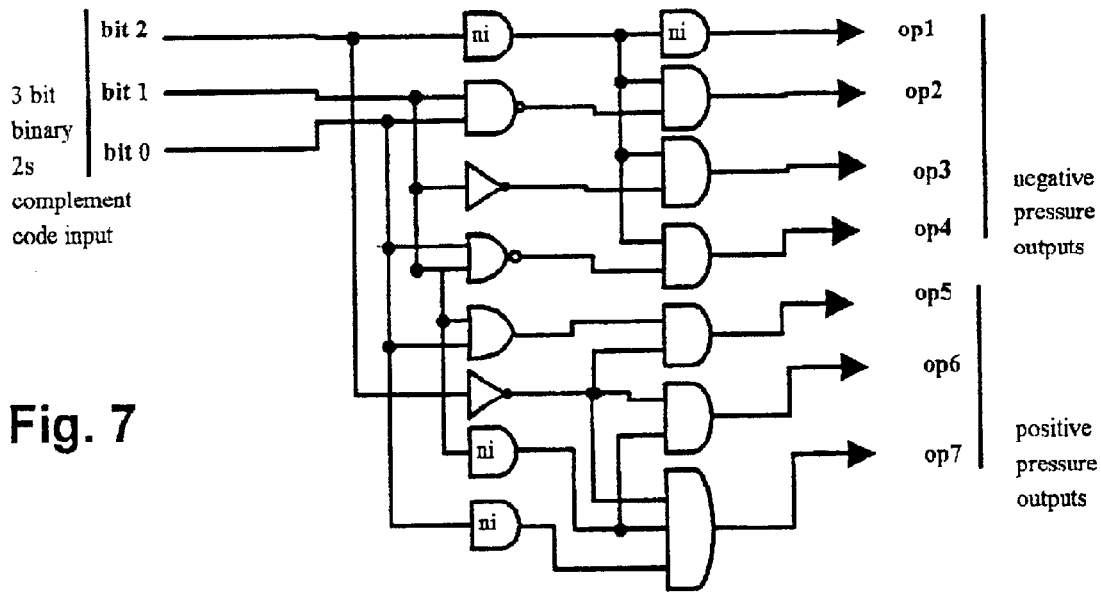
FIG. 7 illustrates simple logic for a 3-bit 2s-complement binary to unary converter.

FIG. 7 shows a simple implementation of this truth table, and once again illustrates that the conversion can be achieved with just 2 levels of simple gates. The gates marked ni in FIG. 7 are simple non-inverting gates used to more equally balance the propagation delay between input and output of all the paths through the encoder.

In a practical digital loudspeaker, one needs to encode possibly 8-bit binary or more. The complexity of the encoder then increases considerably, at least in the sense that a large number of outputs have to be produced, and the number of gates increases accordingly. Also the level of gating will increase if the individual gates themselves are to be kept as simple as possible. It should be noted that the absolute total gate delay through the encoder is usually of no consequence if it is less than 1 msec total. Of some importance is the relative delay of the different input-to-output paths, since in an ideal encoder, all outputs would change simultaneously. Such a condition can be well approximated by keeping the level of gating between input and each output the same. For example, it will be seen that in FIG. 7, every path between input and output traverses precisely two gates. Four gates, marked ni (non-inverting), have been used to provide this path-length matching and have no other logic function.

It should be noted that all of the logic circuits given above for encoders can be optimised by the standard methods. The circuits presented are for illustration only and do not attempt to minimize the number of gates used.

Figure 8:
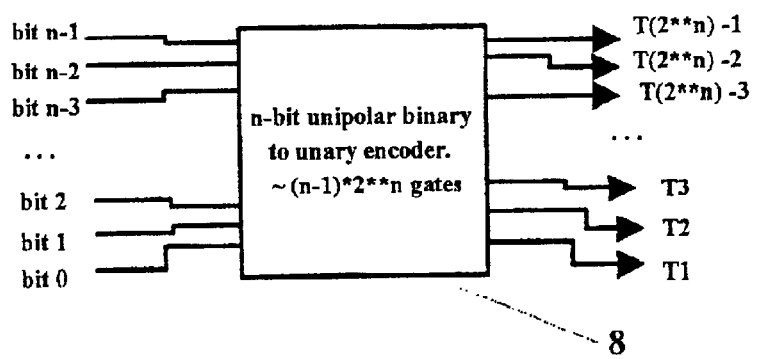
FIG. 8 illustrates the essential inputs and outputs of an n-bit unipolar binary to unary encoder with typical complexity of $\sim(n-1)2^n$ simple logic gates.
Figure 9:
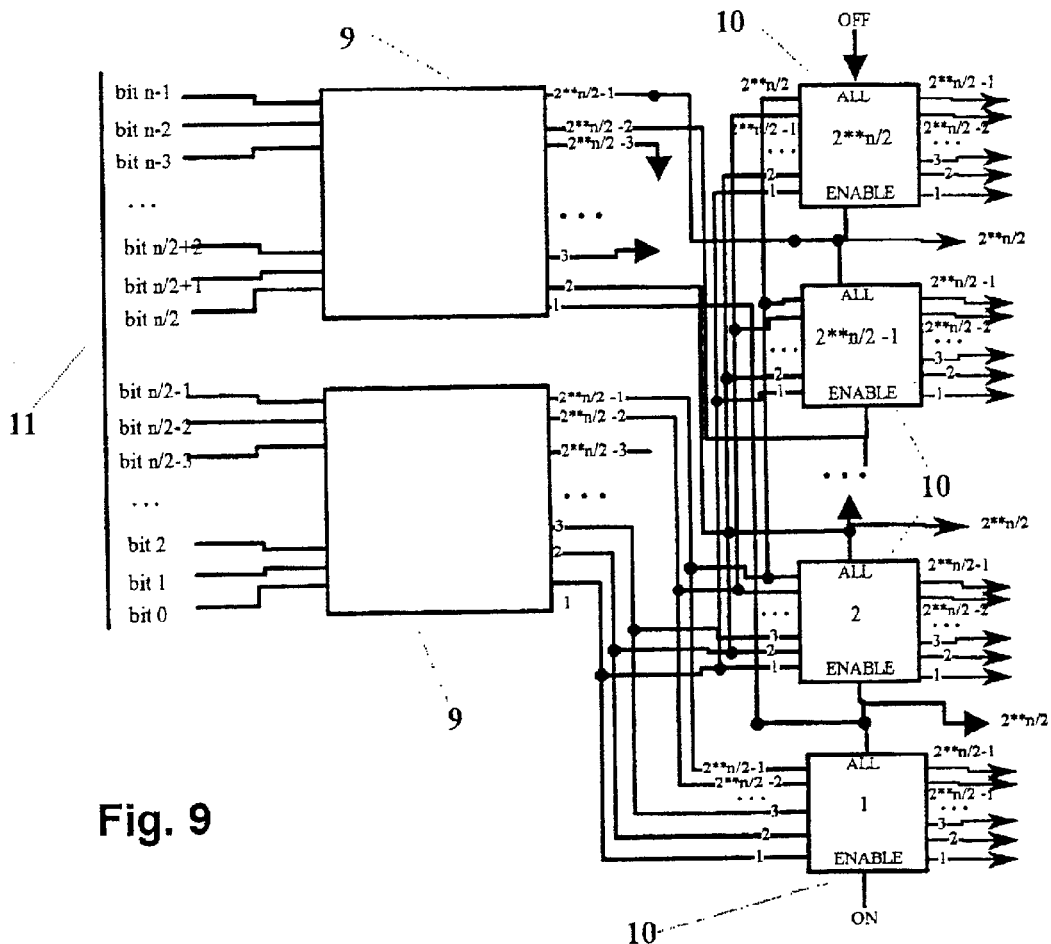
FIG. 9 illustrates a method of assembling an n-bit unipolar binary to unary encoder from two (n/2)-bit binary to unary encoders and some additional simple logic.

As the extension to a bipolar encoder is trivial, as illustrated above, we shall consider unipolar encoders only, below. The number of simple gates in a straightforward unipolar binary to unary encoder increases roughly exponentially with the number of bits of unipolar binary input to be encoded (number of simple gates $\sim(n-1).2^n$ for n-bit unipolar binary), so it is worthwhile looking at ways to reduce the complexity of an encoding system. The requirements of the unipolar unary encoding scheme are that M unary outputs should be on when the digital input number represented has magnitude M. Referring to FIG. 8, consider an n-bit unipolar binary input decoder 8, where n is even. The n input signals can be thought of as 2 sets of n/2 bits. The $2^n-1$ outputs together with a virtual 0 output can be thought of as $2^{n/2}$ sets of $2^{n/2}$ output (note that $2^{n/2} \times 2^{n/2} = 2^n$). The straightforward n-bit encoder will have order of $(n-1).2^n$ gates. The scheme shown in FIG. 9 uses two n/2 bit encoders 9 between which the n binary bits 11 are equally divided, and a little additional simple gating in the logic blocks 10. The logic blocks 10 in this example, of which only 4 out of a total of $2^{n/2}$ are shown, each drive $2^{n/2}-1$ unary outputs and have the same number of standard inputs, each of which turns on one output. In addition, each of the $2^{n/2}$ logic blocks 10 is provided with an ALL input, which when turned ON, turns on all the outputs of the logic block;

in addition there is an ENABLE input, which must be turned ON if any of the standard inputs is to be able to turn on its corresponding output. The $2^{n/2}-1$ unary outputs from the upper encoder 9 are used in addition to the $2^{n/2}-1$ outputs from each of the $2^{n/2}$ logic blocks 10 in the relative positions shown in FIG. 9. Taken together this results in $$2^{n/2}-1+(2^{n/2}-1).(2^{n/2})=2^n-1$$

outputs in total as required for an n-bit unipolar binary to unary encoder. Each of the n/2 bit encoders 9 has order of $(n/2-1).2^{n/2}$ gates, so two of them will have $\sim(n/2-1).2^{n/2+1}$ gates. This can be very much less than the number of gates in an n-bit encoder. For example, if n=10 (a reasonable value for good sound quality), then $(n-1).2^n=9216$ is the approximate number of gates for the standard 10-bit unary encoder, whereas $(n/2-1).2^{n/2+1}=4.2^6=256$ is the approximate number of gates for a standard 5-bit unary encoder, a pair then requiring only 512 gates which is very much less than 9216. Thus the cost of the encoder fabricated in this manner can be much reduced as it is much simpler and uses multiples of the same device (in this example, two of the n/2 bit encoders). This decomposition scheme is not limited to the n to (n/2 times 2) scheme described here for illustration. One can split up the input bits into groups in many other ways and still realise savings in the number of gates and the overall complexity. For example, if n was a multiple of 3, then one could split the n input bits into 3 groups of n/3, (e.g. if n=12, then instead of a single encoder with order of $(12-1).2^{12}=45056$ gates, one could use three 4-bit encoders) and in general, when n is a multiple of k, then the input bits can be split into k groups of n/k.

Figure 10:
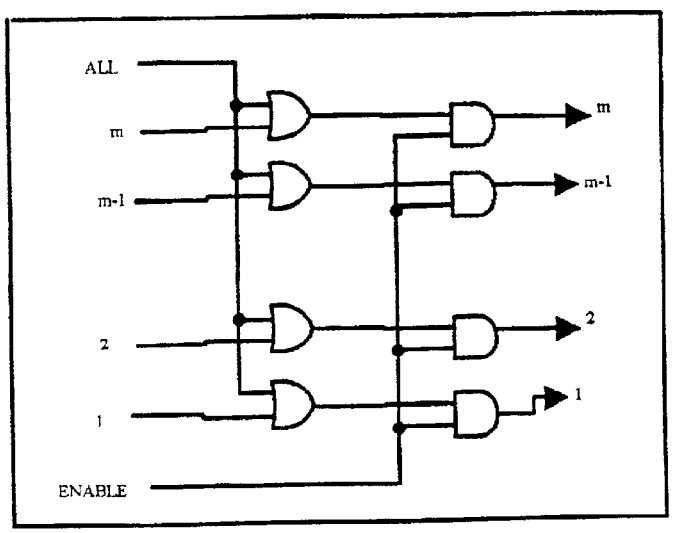
FIG. 10 illustrates details of one of the simple additional logic blocks shown in FIG. 9.

FIG. 10 shows an m input logic block 10, containing extra gating to provide the ALL and the ENABLE functions. Approximately 2 m simple gates are required for an m input logic block. The gating required is very simple, and because multiple such units are required (for our example above where a 10-bit binary input is decomposed into two groups of 5-bits, one would need 32 ($=2^5$) logic blocks each with 32 outputs) their unit cost is much reduced.

Figure 11:
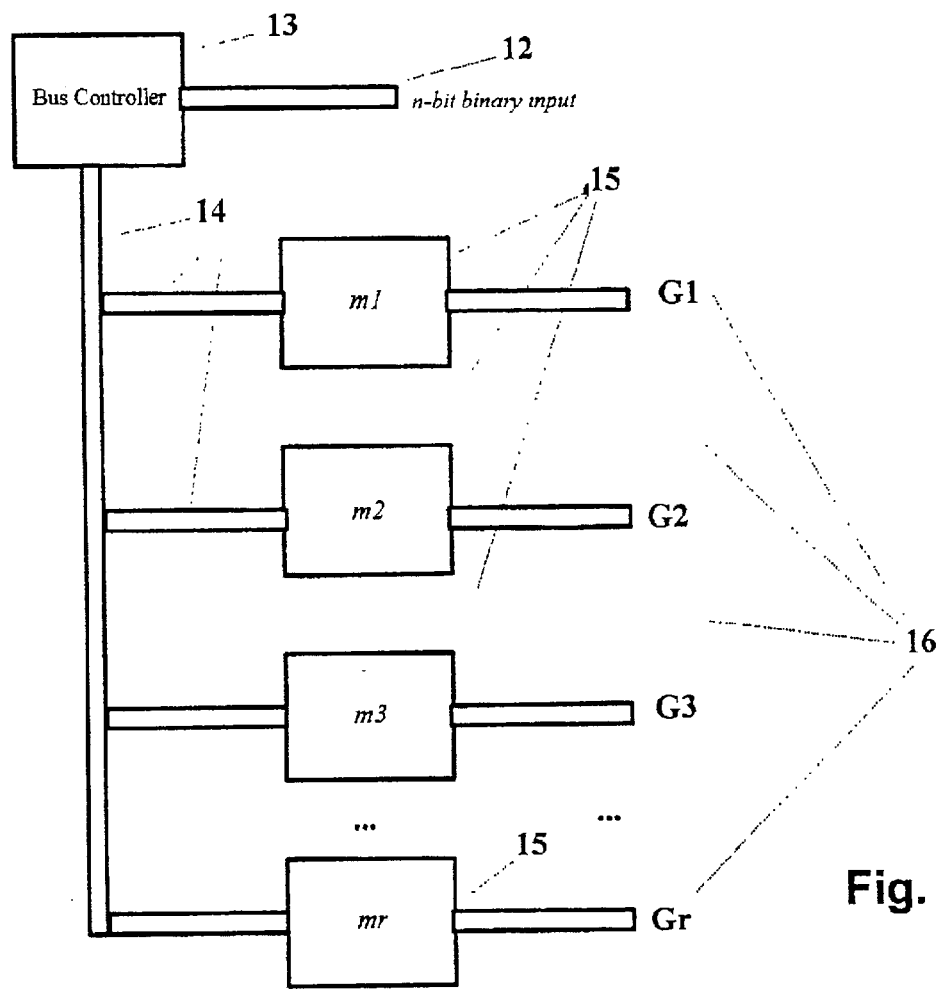
FIG. 11 illustrates a scalable and extendable bus-based binary to unary encoder constructed out of a plurality of identical logic modules connected to the bus and programmed by a bus controller.
Figure 12:
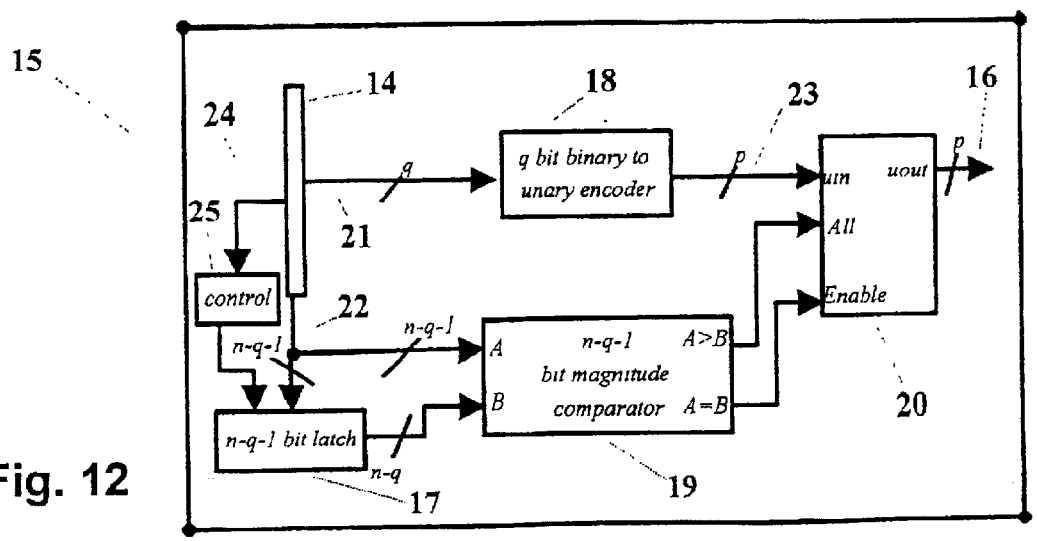
FIG. 12 illustrates in greater detail the possible structure of one of the bussed modules of FIG. 11, which encodes a specific range of the input signals applied to it, into unary.

A different scheme for implementing an n-bit binary to unary encoder is illustrated schematically in FIG. 11, where the n-bit binary input signal 12 is applied via the bus controller 13 to a common data and control bus 14, to which are connected a series of r identical encoder submodules $m_1$, $m_2$, $m_3$, ... $m_r$ shown at 15, each with p encoded unary outputs grouped as $G_1$, $G_2$, $G_3$, ... $G_r$, shown at 16. The nature of the bus structure allows a variable number of identical modules 15 to be added to the bus 14 to provide a variable bit-width binary to unary encoding scheme. In operation the bus controller 13 initialises all the modules 15 via the control and data bus 14 at power-on or reset time, giving each of them a unique address. After that initialisation, n-bit binary data fed into the bus controller at 12 is passed in parallel to all the submodules 15, and depending on each module's address (initialised by the bus controller as described) the modules 15 each decode a unique range of the of the n-bit binary input signal values into p unary outputs, for a total of p.r unary outputs. In one implementation, p is an integer power of 2, e.g. $p=2^q$, and the submodules 15 are implemented as shown in FIG. 12 where the n-bit binary input data section of bus 14 is seen to split into two groups of bits, 21 and 22, with group 21 comprising the q low order data bits and group 22 comprising the n-q-1 high order data bits (excluding the data sign bit) of the bus 14. The q low order data bits 21 are fed into a q-bit unipolar binary to unary encoder 18 where they are converted into p output unary signals at 23 which in turn are connected to the uin inputs of logic block 20. Logic block 20 acts as a switch between the p unary signals 23 at its input uin and the p unary signals 16 at its output uout, and is controlled by two input lines All and Enable. If the All input is on (logic 1) then all p unary outputs 16 are turned on, independent of all other inputs to block 20. If the Enable input is on, then each of the p unary outputs 16 take on the state of the corresponding one of the p unary inputs 23, providing a straight-through gating function. Finally, if neither All nor Enable is on, then all p unary outputs 16 are turned off. The n-q-1 high order data bits (excluding the data sign bit) 22 of the bus 14 are connected to a latch 17 and a magnitude comparator 19. The latch is controlled by signals from control block 25 which in turn connects to the data and control bus 14 via the bus signals 24, which serve to allow the bus controller 13 to load a unique value into each latch 17 at system initialisation time via a mechanism described below (and illustrated in FIG. 13 described later). In operation, after initialisation, the n-q-l bit value stored in latch 17 which is fed to input B of n-q-l bit magnitude comparator 19, is continuously compared to the value on the upper n-q-l data lines (excluding the sign bit) of the data and control bus 14 which is fed to input A of magnitude comparator 19. The A>B output of comparator 19 is connected to the All input of logic block 20 while the A=B output of comparator 19 is connected to the Enable input of block 20. The nett effect of this circuitry is that whenever the binary input data has a value less than the value held in the latch 17 (taking into account its bit significance) then none of the p unary outputs of a submodule 15 will be on. Whenever the binary input data has a value greater than the value held in the latch 17 (taking into account its bit significance) then all of the p unary outputs of a block 15 will be on. Finally when the binary input data has a value equal to the value held in the latch 17 (taking into account its bit significance) then the remaining q low order bits will be encoded into p unary outputs by encoder 18. If r such submodules 15 are connected in parallel to the bus 14 each programmed with a different value in their respective latches 17 then the whole assembly will completely encode the n-bit binary input value onto the p.r unary output lines as required. This configuration has the virtues of simplicity, modularity, and easy extensibility to greater numbers of identical modules 15 and greater numbers of input bits n.

Figure 13:
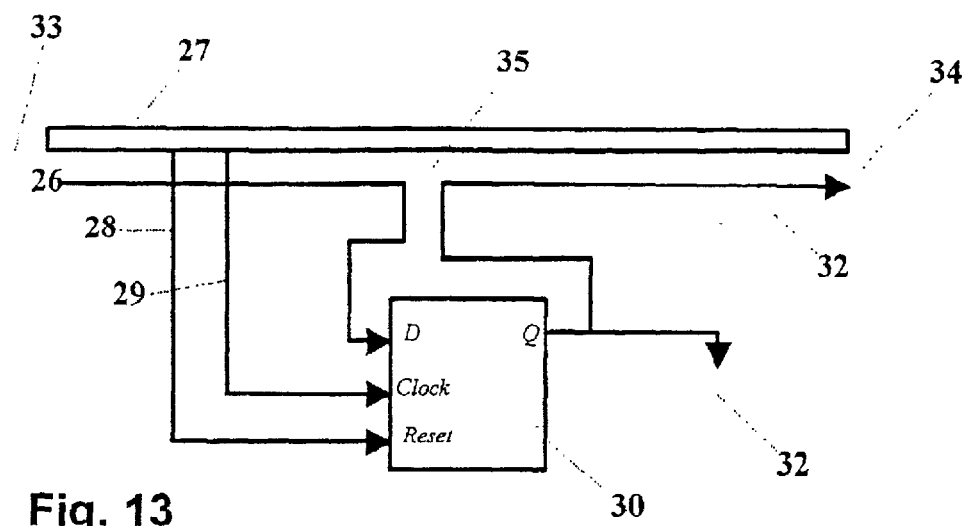
FIG. 13 illustrates details of the simple flip-flop logic incorporated into each of the modules of FIG. 11, in order to allow each to be uniquely programmed by the bus controller illustrated in FIG. 11.

FIG. 13 illustrates a general method of allowing the interconnection of multiple identical modules on a parallel bus structure and providing means of independently controlling each of them, even though they contain no hardwired unique identification codes. In FIG. 13, 27 represents a data and/or control bus for connection to multiple modules in parallel, similar to, e.g., the data and control bus 14 in FIG. 12. One of the lines in the bus 27 is shown separately as 26 and 32, and is broken at each module connection location on the bus as shown at 35. The end of the bus in the direction of the bus controller (e.g. 13 in FIG. 12) is shown as 33 and the control line 26 from that direction is connected to the D input of a standard D-type flip-flop 30 whose Q output is connected so as to drive the line 32 of the bus away from the bus controller, and towards the next module on the bus. The flip-flop 30's clock and reset control inputs are connected to suitable bus control lines as shown as shown at 29 and 28. Whenever line 31 in a module is at logic 1, that module will respond to programming information on the bus lines 27, (because of other circuitry in the module, not shown, but controlled by line 31), but will otherwise ignore it. In operation, to control separately and uniquely all of the modules on the bus 27, each with control circuitry as shown in FIG. 13, the bus controller (not shown in FIG. 13) first issues a reset signal on the line 28 which clears the flip-flops 30 in every module, after which it places a logical high on the Din line 26 which connects only to the first module on the bus. The bus controller then issues a single clock pulse on the clock line 29 which clocks every flip-flop 30. As all flip-flops 30 were previously reset, and all but the first on the bus receive D input signals from the Q outputs of previous flip-flops 30 on the bus lines 32, only the first flip-flop 30 on the bus will clock in a logic 1, all the rest clocking in a logic 0. At this point the bus controller places a logic 0 on the Din control line 26 and issues any required control signals destined uniquely for the first bus module. Only module 1 will respond to the control information as it will be the only module whose line 31 is at logic high as previously described. Thereafter, the bus controller maintains a logic 0 on the Din control line 26, and issues successive clock pulses on line 29 which have the effect of shifting out the logic high on line 31 of one module into the flip-flop 30 of the next module, whilst shifting in logic zeroes everywhere else, the whole structure operating similarly to a serial shift register, and between successive clock pulses the bus controller issues programming and control information for the one module currently activated by its control line 31 which is currently holding the single pulse in the shift register structure so formed. If desired, the bus controller may additionally be connected to the far end of the control bus (away from the bus controller) via a spare line, connected to line 32 in the last module only on the bus, and in this way, by awaiting the arrival of the shifted-through pulse in the shift register, the bus controller can determine that all modules on the bus have been programmed, and may also count the number of such modules present, which is useful in a variable modular structure where flexible programmability is desired.

As the transducers 4 in FIG. 1 are what produce the external sound (acoustic) power from the electrical signals within the digital loudspeaker, the transducer drivers 3 have to raise the digital signal levels to a power level adequate to produce the desired output sound power, taking into account the efficiency of the output transducers. The level required will depend on the type of transducers used, e.g. piezo-electric, electrostatic, moving-coil magnetic, magnetor-estrictive. In digital logic terms, the transducer drivers 3 are simply pulse amplifiers. In practical terms, they may also be required to produce some pulse shaping, to compensate for the transfer function of the transducers 4, so as to maintain an approximately square sound-pulse shape. It should however be noted that the total output sound power of a digital loudspeaker with N output transducers is P=N×p, where p is the output sound power of a single transducer. Thus, if e.g. ~one watt of sound power is required (roughly equivalent to that from a conventional moving coil hi-fi loudspeaker driven with 100W of electrical power), then an 11-bit digital loudspeaker with ~1024 transducers would require p=~1 mW output from each individual transducer. Such power levels are easily available directly from logic gates. Allowing for low efficiency electro-acoustic transducers (say as low as ~1%) still only requires ~100 mW of electrical drive power per transducer which is easily accommodated by a standard buffer logic gate operating at for example 5V and 20 mA. Thus, practical digital loudspeakers may have their transducer array elements directly driven from suitably selected standard logic components.

Figure 14:
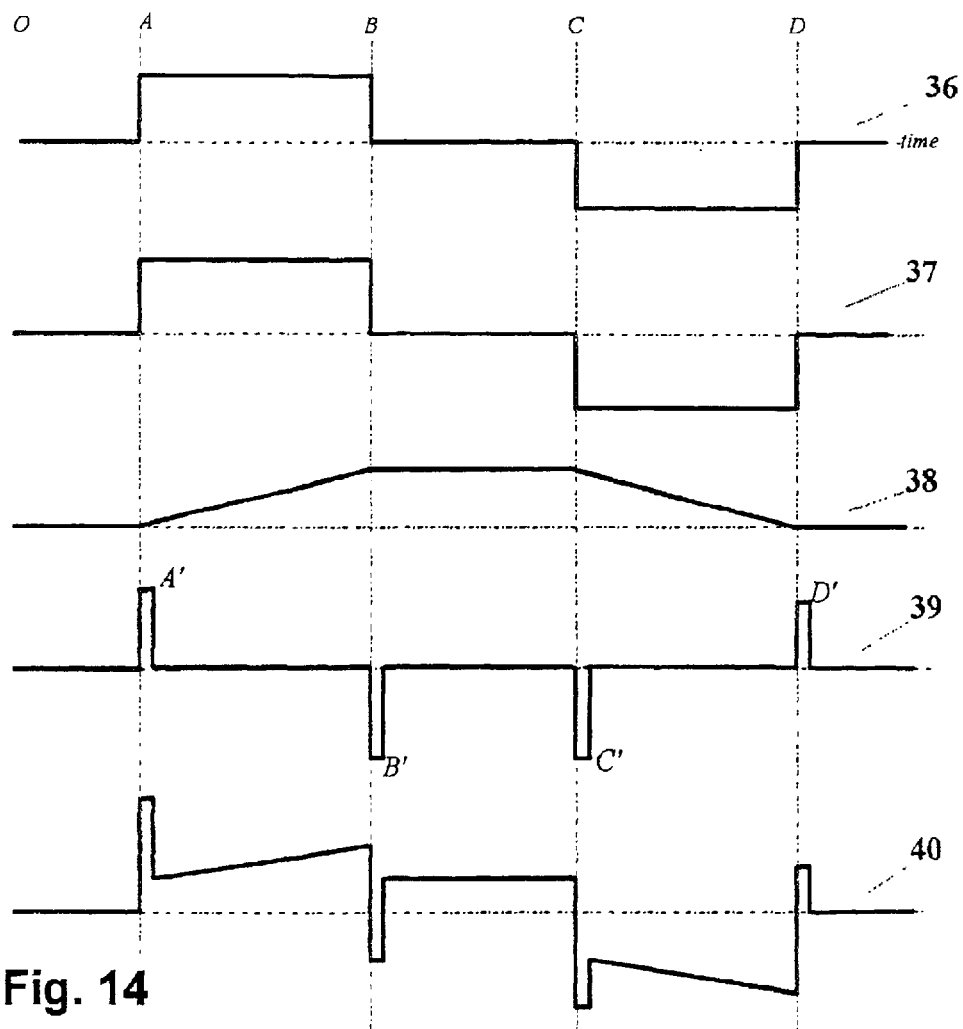
FIG. 14 illustrates an example unary signal waveform and associated suitable drive waveforms for acoustic transducers with various dynamical properties in order to produce acoustic pulses of approximately square shape.

FIG. 14 shows five electrical waveforms 36, 37, 38, 39, 40 as a function of time along the horizontal axis. 36 represents a typical bipolar unary electrical signal available from the binary to unary encoder after combination with the sign information, which corresponds to the desired pressure output from one transducer of the digital loudspeaker that is the subject of this invention. The waveform section shown encompasses a period of zero pressure demand between time 0 and time A, a constant positive pressure demand from time A to time B, a further period of zero pressure demand from B to C, followed by a period of constant negative pressure demand from C to D, and thereafter zero pressure demand. To a first approximation, the transducer diaphragm must move with constant velocity to produce constant pressure, and zero velocity to produce zero pressure, and therefore waveform 37 is illustrative of the required velocity profile with time for a transducer to produce the pressure profile shown in 36. We make the simplifying assumption here, that is generally true for common transducers, that the input drive voltage or current waveform to the transducer corresponds to the force produced on the transducer diaphragm. For a transducer where the dominant reaction force on the diaphragm is resistive or viscous due to the resistance of the air being moved in the production of sound, then waveform 37 (which is substantially the same as 36 apart from perhaps scale) represents a suitable force-time profile to achieve the desired pressure waveshape in 36, and in turn is also a suitable electrical drive waveshape, so essentially no pulse shaping is required in this case. For a transducer where the dominant reaction force on the diaphragm is a restoring force proportional to the deflection of the diaphragm, as might be produced by a diaphragm suspension, then waveform 38 represents a suitable force-time profile to achieve the desired pressure waveshape in 36, where it will be seen to consist of constant ramp rate sections between A and B, and C and D, of opposite slope, and constant levels of zero slope elsewhere, since such constant ramp rates correspond to linear increases of force, and thus displacement with time, resulting in approximately constant pressure output for these periods. For a transducer where the dominant reaction force on the diaphragm is inertial due to the mass of the moving parts of the transducer and entrained air, then waveform 39 represents a suitable force-time profile to achieve the desired pressure waveshape in 36, where at time A a short duration positive driving force terminating at time A' is produced to give a positive impulse of momentum to the transducer's moving mass, after which the mass coasts at approximately constant positive velocity until time B, where it is given a short negative impulse until time B' to bring it quickly to rest again, whereafter at time C a further short negative impulse is given until time C' to give the moving mass a negative impulse of momentum, followed by a further coasting period at substantially constant negative velocity until time D at which a short positive impulse until time D' is applied once more bringing the moving mass to rest. For a transducer with mixed dynamics where the dominant forces are some combination of the three identified above, a composite drive waveform, an example of which is shown at 40, comprising some suitable linear combination of 37, 38 and 39 may be applied to produce square-form acoustic pulse pressure output as required.

Figure 15:
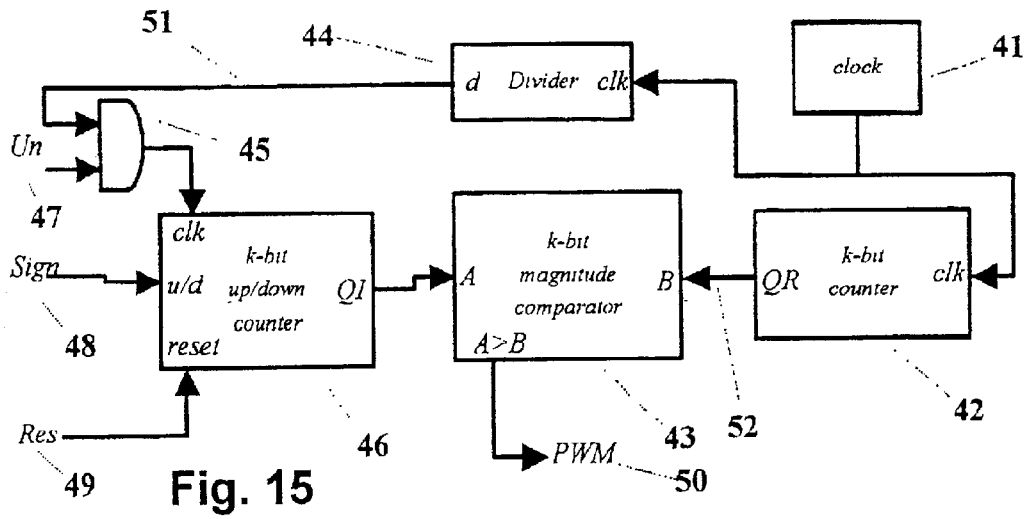
FIG. 15 illustrates simplified logic for a digital pulse width modulation (PWM) system for producing linear ramp PWM waveforms from a unary signal and a sign (polarity) signal.

Waveform 37 may be produced with high electrical efficiency in a standard pulse amplifier. Waveform 38 may also be produced with high electrical efficiency by means of pulse-width-modulation (PWM) of a suitably high frequency pulse waveform in the following manner. FIG. 15 illustrates a novel digital pulse width modulation ramp generator, comprising a high frequency clock generator 41, which feeds into the clock input of a k-bit binary counter 42 with parallel binary output QR at 52 which in turn feeds into one of the two parallel binary inputs (B in this case) of a k-bit binary magnitude comparator 43. There is also a digital divider 44 connected to the clock 41, the output d of 44 shown as 51 being connected to one of two inputs of an AND-gate 45. The unary signal $U_n$ shown at 47 which is to be shaped as a ramp as shown for example at 38 in FIG. 14, is connected to the other input of the AND gate 45 with the result that whenever $U_n$ is at logic one, clock pulses from d of divider 44 issue from the output of the AND gate 45 from where they are connected to the clock input of k-bit binary up/down counter 46, and otherwise the output of the AND gate is at logic low. Up/down counter 46 has its up/down control input connected to the sign-bit (or unary sign signal) of the digital loudspeaker circuitry and determines whether counter 46 will count up when a clock pulse arrives at its input, or count down. The reset input of counter 46 is arranged to set the counter to half full count when activated (e.g. if k were equal to 10, so that 46 had a maximum count of $1023_{10}=1111111111_2$ (binary), then reset might be arranged to set the counter to $511_{10}=0111111111_2$) and is connected to an external signal Res shown at 49 which might for example be issued by the bus controller 13 at system initialisation time, or possibly at other times when the desired output signal from the unary output $U_n$ was zero. The k-bit parallel binary output QI of up/down counter 46 is connected to the parallel binary input A of comparator 43, such that the comparator continuously determines the magnitude of the output QI of 46 relative to the magnitude of the output QR of 42, output A>B of comparator 43 then being at logic high whenever QI>QR. Details of data synchronization are not shown for simplicity. The effect of this logic circuitry is that after reset time (i.e. after a Res pulse has been sent to 49 from outside the circuit block) and while $U_n$ remains at logic low, the counter 46 stays static at half-full count while counter 42 cycles throughout its k-bit count range with period $P=2^k/f$ where f is the frequency of digital clock 41, and thus output PWM shown at 50 derived from output A>B of 43, spends precisely half its time at logic low and half at logic high. This output 50 therefore has period P and mark-space ratio of 1:1. Starting from this state, when $U_n$ goes to logic high, then depending on the state of the Sign input, counter 46 either counts up or down from its initial half full count at a constant rate determined by the divided clock signal 51 so that its instantaneous output value V available in parallel binary at QI from counter 46 is linearly varying with time at a rate of f/D counts per sec, where D is the division ratio of clock divider 44. If the clock rate f of counter 42 is large compared with f/D (i.e. if D>>1) then V may be assumed substantially constant over a counter 42 period P, in which case the PWM signal 50 will be high for the fraction $V/(2^k-1)$ of the period P where $0 \leq V \leq (2^k-1)$, which is exactly the condition required for the signal 50 to be a linear pulse width modulated representation of value V. It can be shown that even when the condition f>>f/D does not hold, that the circuit still produces linear pulse width modulated signals at output 50. As the value V increases or decreases linearly with time when $U_n$ is at logic one (depending on whether Sign is at logic high or low), the effective value of the PWM output 50 (which is just the time average of output 50 during a period as long as or longer than the peiod P) is a linear ramp while $U_n$ is on and a static value when $U_n$ is off, which is precisely the condition required to generate the type of waveform illustrated at 38 in FIG. 14, for driving spring-limited transducers to produce clean square digital acoustic pulse outputs. In practice additional circuit refinements are useful, one of which is to configure counter 46 as a dead-end counter so that when it reaches either maximum or minimum count it will not roll-over, but instead remain at its terminal count value until the count direction (up or down) reverses and the next clock pulse arrives. This adds significant stability to the PWM generator. It is not essential that the clock input clk on counter 46 be derived from the same clock 41 as used for counter 42 as shown, although this again assists with stability. Additional stability can be achieved in the digital loudspeaker application of this circuit by synchronizing clock 41 with the digital loudspeaker input-data sampling clock, and separately, by driving the Res input 49 high, whenever the input data word value on the control bus represents zero. Also, for the digital loudspeaker application, it is essential that the full-count period of counter 46, which is $T=2^kD/f$ is greater than or equal to the half-period of the lowest frequency audio signal that it is desired to be faithfully reproduced by the speaker, typically 25 ms for a 20 Hz lower cut-off frequency. In the application of this PWM generator for a digital loudspeaker it should be noted that circuit components 41, 42 and 44 may be shared amongst a large number of individual PWM generators assigned each to a distinct unary output $U_n$, so the saving in parts is considerable. It should be noted that this digital method of creating pulse width modulated (PWM) waveforms has applications outside of digital loudspeakers wherever PWM is useful.

Figure 16:
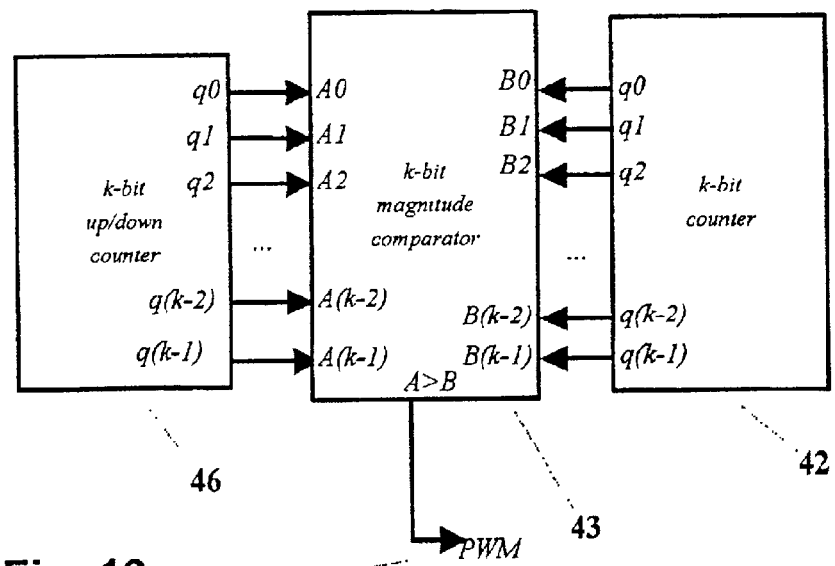
FIG. 16 illustrates the conventional manner of interconnecting the counters and the magnitude comparator that are components of the system shown in FIG. 15.
Figure 17:
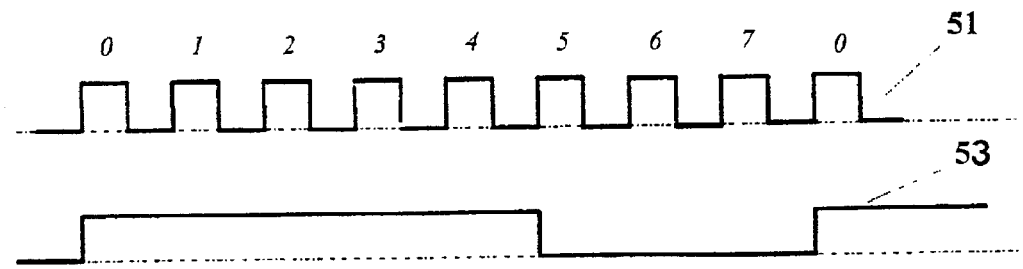
FIG. 17 illustrates typical PWM waveforms produced by the circuit of FIG. 15 with the interconnection pattern shown in FIG. 16.
Figure 18:
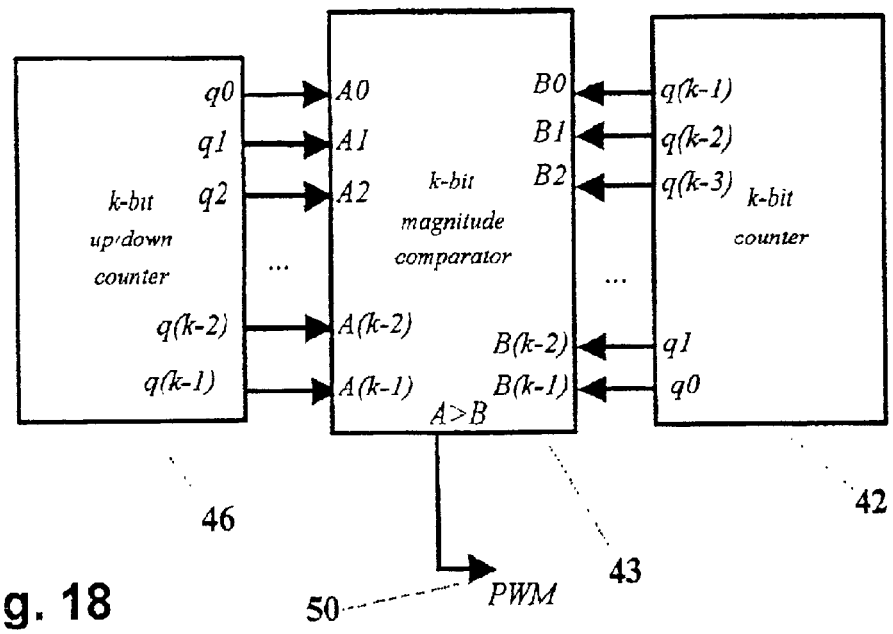
FIG. 18 illustrates an improved method of interconnecting the counters and magnitude comparator of FIG. 15.
Figure 19:
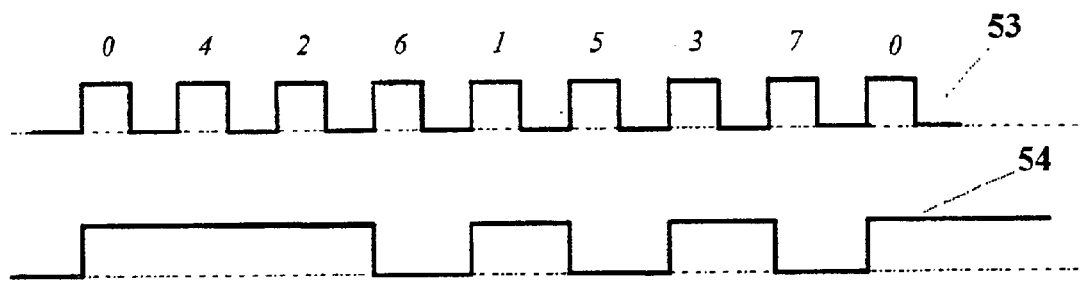
FIG. 19 illustrates the improved PWM waveforms produced by the interconnection pattern of FIG. 18 when applied to the circuit of FIG. 15.

A common requirement of PWM systems is a low pass filter system to reduce the high frequency switching noise in the final output drive waveform. Such low pass filters are more complex and expensive to construct, the closer the PWM clock rate is to the highest modulation frequency required to be reproduced in the low pass filtered output. A method, which uses no extra components, of maximizing this frequency ratio for a PWM generator of the kind illustrated in FIG. 15 is now described. FIG. 16 shows in some more detail the conventional method of interconnecting the two counters 42 and 46 to the magnitude comparator 43, where it will be seen that the least significant bit outputs of the counters 46 and 42 shown as $q_0$, $q_1$, $q_2$, . . . are connected to the least significant bit inputs of the comparator 43 shown as $A_0$, $A_1$, $A_2$, . . . and $B_0$, $B_1$, $B_2$, . . . and the rest of the bits are connected in the same sequence right through to the most significant bits $q_{k-1}$ connected to $A_{k-1}$ and $B_{k-1}$. This method of connection results in a PWM output waveform at 50 that has a pulse period of $2^k/f$ where f is the clock frequency of counter 42 and k is the number of bits in that counter. As an example, for the simple case where k=3, and where the value (assumed static) represented by the output of counter 46 is $101_2=5_{10}$ then FIG. 17 shows at 52 the expected waveform at output 50 with mark:space ratio of 5:3, and at 51 the clock input signal to counter 42 and marks the counter 42's count state above each clock pulse as 0, 1, 2, . . . 7, 0, etc. Waveform 52 results because while counter 42 is in the first five states 0 to 4 its output is less than that of counter 46 assumed static at value 5 in this example, and so the A>B output of the comparator is at logic high for these states, after which it goes low for the rest of the counter 42's cycle. In the improved version of the circuit, shown in FIG. 18, it will be seen that the bit order of the connections between the bit outputs of counter 42 and the bit inputs of comparator 43 have been reversed so that the most significant output bit of the counter $q_{k-1}$ is now connected to the least significant bit input $B_0$ of comparator 43 and this bit-order reversal is carried through for the other bit connections between these devices right through to $q_0$ connected to $B_{k-1}$. The effect of this bit reversal is to alter the count sequence seen on the $B_1$ ($0 \leq 1 < k$) inputs of comparator 43 when viewed in the conventional bit order, with $B_0$ being the least significant bit of this comparator input. The actual count sequence seen for the previously given example (with k=3, and where counter 46 has value 5 on its outputs) is shown at 53 in FIG. 19. The resulting PWM output from 50 in the modified circuit is shown at 54 in FIG. 19, where it will be seen that whilst it still has the same required average mark-space ratio as the previous arrangement (shown at 52 in FIG. 17) of 5:3, it now consists of three cycles during one period of counter 42 rather than just one. This is precisely the effect required to reduce the effort of low pass filtering. It will be apparent to those versed in the art that this novel technique of raising the effective pulse rate of the PWM output waveform is generally applicable to all applications of pulse width modulation and is not restricted to use in the digital loudspeaker invention presented here. Other reorderings of the bit connections between 42 and 43 than the one shown here are useful in this respect but it can be shown that the bit-reversal ordering gives the maximum number of output transitions over the full range of PWM output states. In particular, the bit-reversed ordering produces an output at 50 that transitions on each clock pulse to counter 42 when the counter 46 is at half-full count, which is the maximum possible output frequency from such a circuit, with 50% or 1:1 mark-space ratio.

Figure 20:
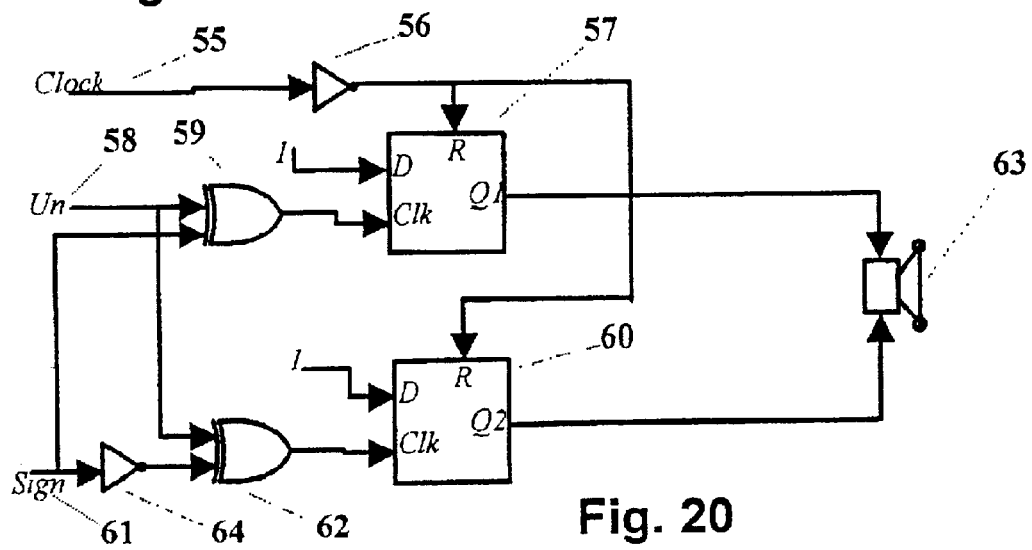
FIG. 20 illustrates a simple logic circuit for producing a dual bipolar impulse drive for a transducer with inertia-dominated dynamics.
Figure 21:
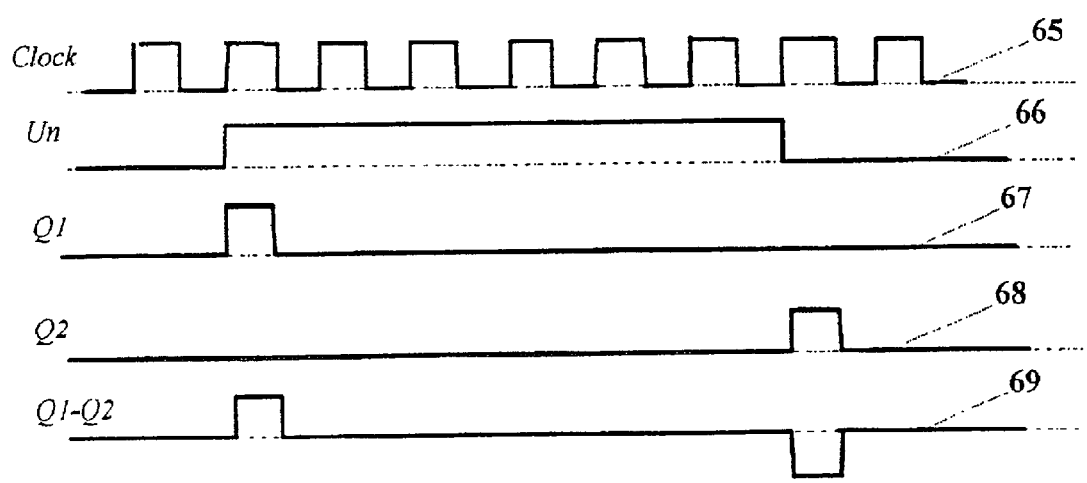
FIG. 21 illustrates typical waveforms for the circuit shown in FIG. 20.

A digital method of producing a waveform of the type shown at 39 in FIG. 14, for the driving of mass-limited (inertia dominated) acoustic transducers is illustrated in FIG. 20, where a unary input signal $U_n$ at 58 and the Sign signal drive the clock inputs Clk of a pair of flip-flops 57 and 60 via a pair of exclusive-OR gates 59 and 62 and an inverter 64, in such a way as to clock in a logic-1 into the D input of one of the flip-flops on the leading edge of the $U_n$ signal and into the other flip-flip on the trailing edge, which flip-flop responds to which edge being dependent on the Sign signal. In the configuration shown, when Sign is at logic low then flip-flop 57 is clocked by the leading (rising) edge of $U_n$ and flip-flop 60 by the trailing (falling) edge. The leading and falling edges of $U_n$ are arranged to be synchronous with the rising edges of the clock signal Clock at 55 (whose waveform is shown schematically at 65 in FIG. 21) which is applied through an inverter 56 to the reset inputs R of the flip-flops 57 and 60. The nett effect of this configuration is that when $U_n$ goes high (see FIG. 21 waveform 66) one of the flip flop outputs goes high and is then reset to 0 half a clock cycle (of Clock) later as shown at 67 and when $U_n$ next goes low the other flip-flop output goes high for half a cycle of Clock and then goes low too as shown at 68. If the two flip-flop outputs Q1 and Q2 are used to drive a transducer 63 in push-pull as illustrated in FIG. 20 either directly or via transducer driver circuitry, the transducer is driven by their difference signal which is shown at 69 in FIG. 21. This waveform is precisely of the form required, as shown at 39 in FIG. 14, to drive an inertia dominated acoustic transducer in order to produce clean acoustic pulses.

Because the output of the digital loudspeaker is synthesised from a large number of pulses, rather than smooth analogue waveforms, there will be frequency components in the output outside the normal range of hearing, generally reckoned to be ~20 Hz to ~20 KHz. As these components are by definition inaudible to humans, it is possible to simply ignore them. However, loud sounds in the range 20 KHz to 60 KHz can cause a certain amount of alarm and distress in domestic animals, and it may be necessary to reduce such emissions as much as possible.

One approach is to place an acoustic low-pass filter over the output transducer array to absorb such frequencies directly at their point of generation. A material with a heavy sound absorption above ~20 KHz but which is practically acoustically transparent below ~20 KHz will provide the required filtering.

A second approach is to minimise the high frequency emissions from the transducers themselves. This can be done by ensuring that even at the highest frequency of operation, the resolution of the digital loudspeaker (in terms of bits, or unary digits) is kept as high as possible. The Nyquist theorem tells us that to adequately reproduce a 20 KHz sine wave from digital samples we need to sample at a frequency of at least 40 KHz. In practice, reproduction of a sine wave from so few samples (i.e. just 2 per cycle, when sampling at the nyquist rate) can only be achieved with a perfect low pass filter. The filtering requirements can be much reduced if instead we sample at a rate much higher than the nyquist rate. If the digital input signal is available at a suitably high sampling rate then no more needs to be done other than to maintain that sampling rate throughout the digital loudspeaker. If, however, one was to drive a practical digital loudspeaker from, say, digital audio signals derived from a Compact Disc, which is sampled at ~44 KHz, then one would need to interpolate the digital samples to create a higher sample rate. Such a process is already done to some extent in better quality compact disc players to ease the filtering requirements when converting the digital signals to electrical analogue signals for further amplification. Here, we are suggesting that a similar process be performed on low-sampling rate digital input signals to ensure that the sound output signals from the digital transducers of the digital loudspeaker should have less spurious high frequency content.

This design of digital loudspeaker using unary code at the output transducers, ensures that individual transducers will turn on and off only once per cycle of sine wave output, independent of the resolution of the digital output, enabling this digital interpolation process to be carried out to any degree without increasing the specifications of the output transducers in terms of their frequency response. This independence is not the case if binary, ternary, or other number— (greater than or equal to 2)—based digital coding is used.

Figure 22:
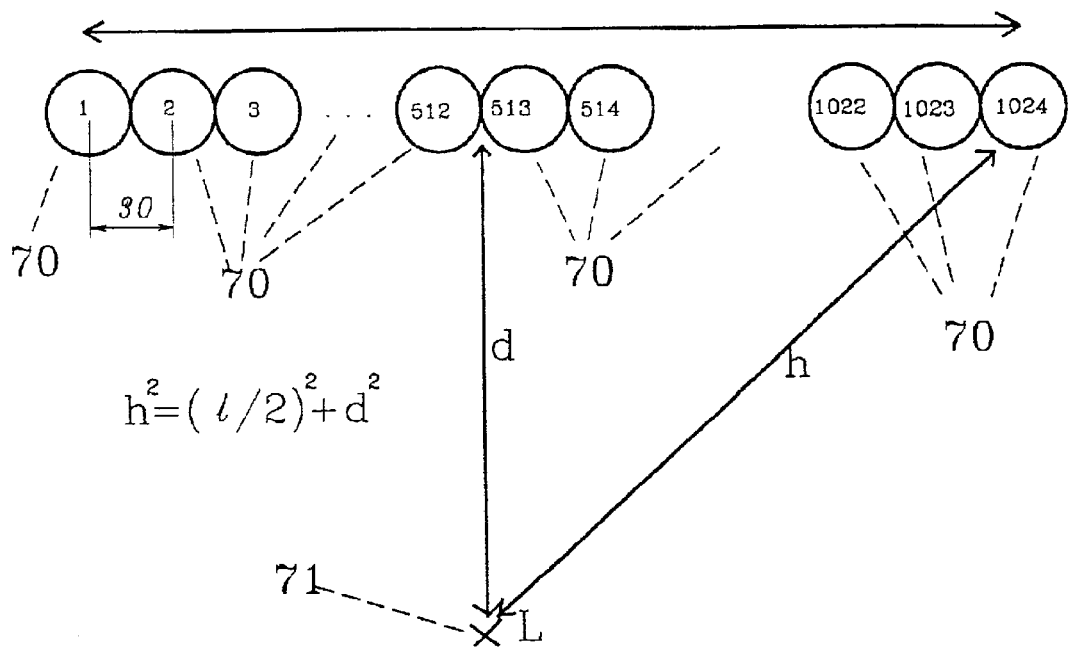
FIG. 22 illustrates the time-delay problems caused by extended arrays of multiple acoustic transducers.

In this design of digital loudspeaker, the output sound is produced by an array of transducers acting together and in concert. No individual transducer alone reproduces the desired output sound signal. It is therefore important that a human listener be placed in such a position that an integrated effect is heard from all of the transducers equally, as far as is possible. If the transducers have finite size then they will necessarily be separated in space from one another. Arrangements of transducers that minimize the path length differences between individual transducers and the listener therefore are desirable. For example, if there were 1024 (=32×32) transducers 70 as shown in FIG. 22, and if the transducers 70 were circular and say 30 mm in diameter, then one possible arrangement would be to lay the transducers all out along a line. Even if the spacing between them was zero, the line of transducers would be 30×1024 mm=~31 meter which in itself is already impractical. Therefore, (refer to FIG. 22) for the path length d from the middle transducers to the listener 71 at L to be no less than, say, 10% smaller than the path length h from the outer pair of transducers to the listener, it is necessary for the listener distance to the array d to be at least ~32 m. For much closer than 10% path length matching, this listener distance increases proportionately. Clearly this is impractical for most (domestic) listening purposes.

Figure 23:
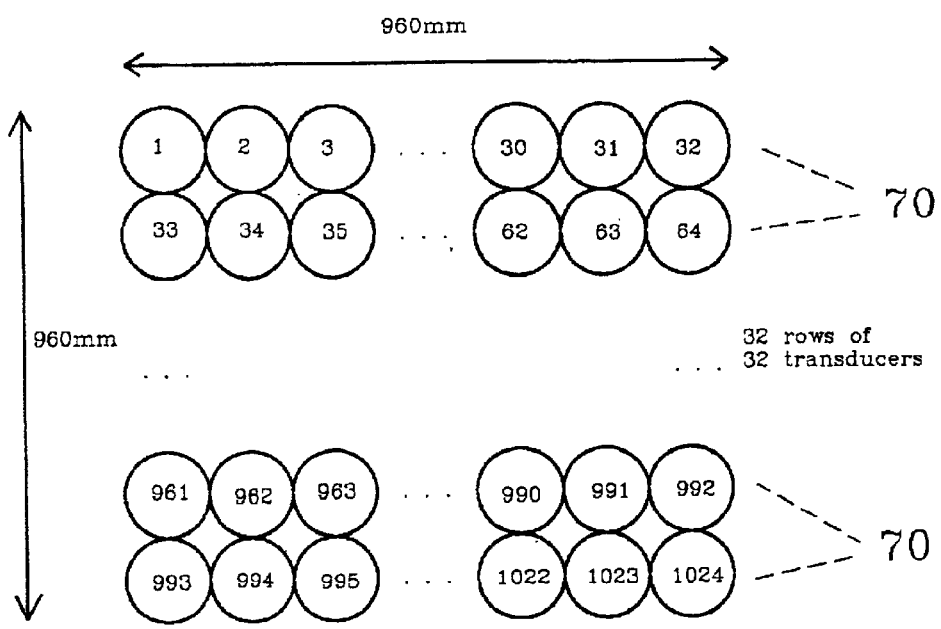
FIG. 23 illustrates how much more compact an array of acoustic transducers may be made by arraying them in two dimensions rather than one.

In order to minimize the least acceptable listening distance, it is therefore important to minimize the spatial extent of the transducer array. This can be done by laying out the transducers 70 in as tight a two dimensional arrangement as possible, and regular circular, hexagonal and square array shapes are close to optimum from this perspective. For the example above, if a square array of 1024 30 mm diameter transducers 70 was laid out as per FIG. 23, then the array becomes 960 mm wide by 960 mm high (i.e. 32 times shorter than the linear array sketched in FIG. 22, and the corresponding listening distance falls from 32 m to ~1 m which is much more practical.

A second way to minimize the extent of the array of a given number of transducers, is to make the transducers themselves smaller across their aperture. For example, for the array shown in FIG. 23, if the transducers 70 were 3 mm across their aperture instead of 30 mm, then the array of 32×32 transducers could be made as small as 96 mm square, and the minimum listening distance according to the same criterion as described above, would fall to 10 cm.

So, compact two-dimensional arrays of small transducers are best for listening from practical distances.

Figure 24:
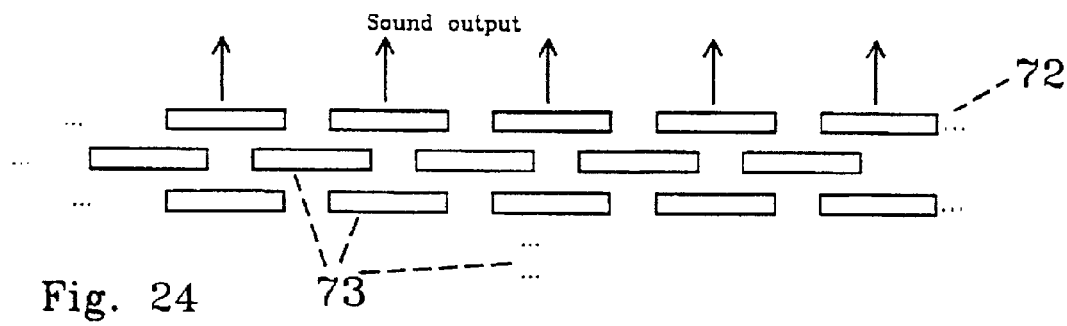
FIG. 24 illustrates in section how multiple two-dimensional arrays of transducers may be stacked in three dimensions to produce a more compact sound source when gaps are placed in each array to allow through the passage of sound.
Figure 25:
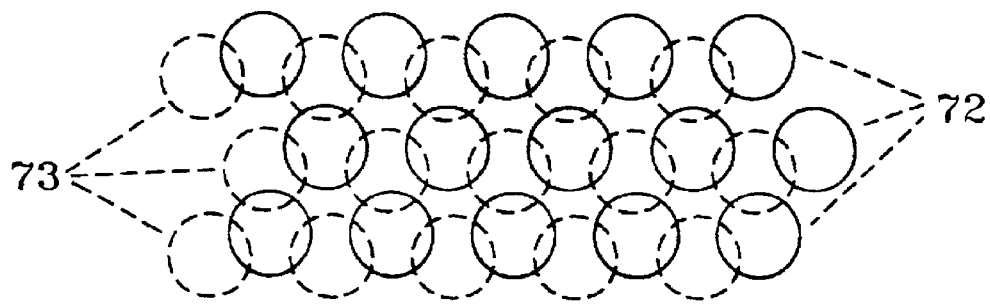
FIG. 25 illustrates in plan view a similar arrangement to FIG. 24.

If the transducers themselves are thin, front to back, then the array size can be reduced even further by producing a multi-layered three dimensional arrangement of transducers where a front two-dimensional array of transducers is placed over one or more further two-dimensional arrays of transducers behind it, with the sound from the rear arrays passing through gaps between the front arrays, or through holes in the transducers themselves. If the transducers are necessarily circular (for example, because of their method of construction), then any regular array of circular devices necessarily has gaps in it, as circles of one size do not tessellate. This multi-layered two dimensional arrangement then becomes attractive, and allows a very compact array to be constructed, even when using a large number of transducers. Staggering successive two dimensional arrays allows the centres of the rear transducers to align with the centres of the gaps or holes in the front transducer arrays. FIG. 24 showing a side view and FIG. 25 showing a front view of such a three-dimensional array of transducers illustrates these principles. In order to synchronize the sound pulses received by the listener from the different layers in the third dimension, it may be desirable to add differential digital delay to the signals in each layer to compensate for their different distances from the listener (see below).

Figure 26:
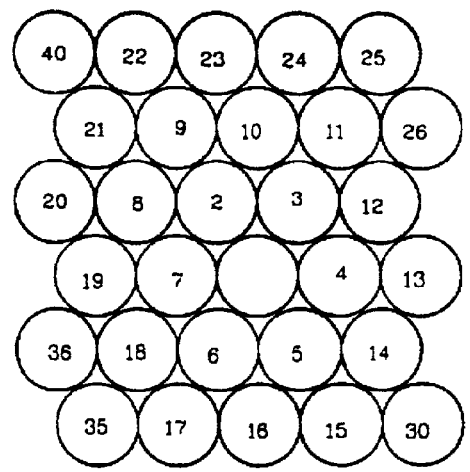
FIG. 26 illustrates a compact two-dimensional array of transducers each positioned so that it is adjacent to transducers associated with adjacent signal levels.

Because unary digital code has no particular positional significance, we are free to connect the unary digital outputs from the transducer drivers, to transducers in the array(s) in any spatial manner suitable. As quieter sounds will be reproduced with smaller total numbers of transducers active than louder sounds, it is optimal to keep transducers related to adjacent input signal levels, physically adjacent in the output transducer array. In this manner, the overall size of the sound source is kept as compact as possible at all sound output levels. Furthermore, if the geometric centre of the group of transducers used to reproduce any particular sound level, is kept as close to the geometric centre of the whole array as possible, then the apparent sound source position will appear to move the least with changes in reproduced sound level. Thus, good patterns of interconnection of transducers to transducer drivers, include tight spirals centred on the geometric centre of the array (with the obvious extension to three dimensions if a multi-layered array is used). FIG. 26 illustrates this principle for the special case of a hexagonal two dimensional array of circular transducers. Its extension to square arrays and other regular two-dimensional and three-dimensional array structures is straightforward.

In order for the listener's hearing system (ear & brain) to be able to properly integrate the array of pulses from the digital loudspeaker so as to reconstruct the desired sound, it is important that sound pulses from the different transducers in the output array arrive with the correct time relationship (i.e. at the same relative times as the parts of the original input signal they represent). As the transducer array is distributed in space in two or three dimensions, a listener not placed a very long way from the loudspeaker will hear the different sound pulses at times affected by their spatial positions in the array. This is illustrated in FIG. 27 where a listener is on the left at L and a two or three dimensional array (drawn schematically in cross section) is at the right with just a few ($T_1$, $T_2$, $T_3$, $T_5$, $T_6$) of many transducers shown. It will be seen than all the transducers $T_1$ (i=1, ... N) in general are at unique distances $D+d_1$ from L, where D is the distance to the nearest transducer to L, shown for example at $T_5$ in FIG. 27. The time of arrival $t_1$ of pulses at L emitted simultaneously from all transducers $T_1$ at time t will be $t_1=t+(D+d_1)/c$ [where c is the velocity of sound], which in general is different for every transducer.

Figure 29:
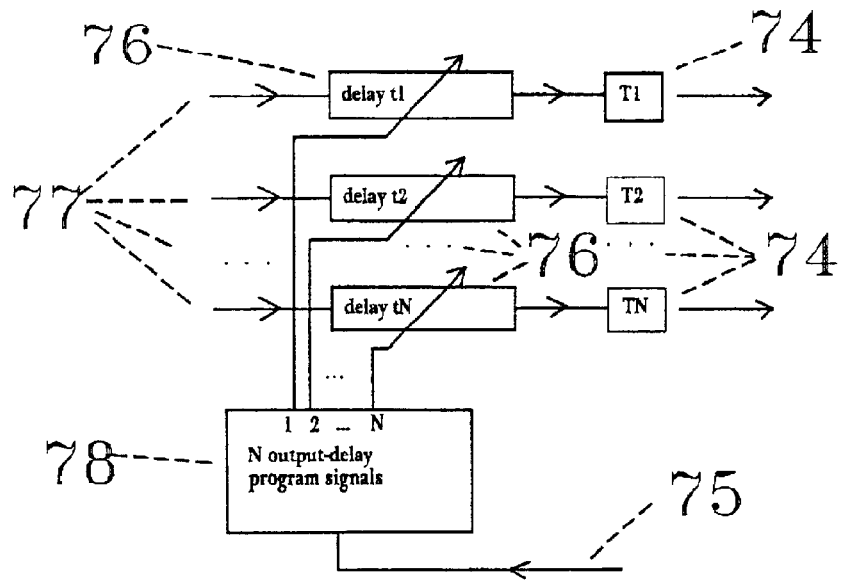
FIG. 29 illustrates how a delay system as illustrated in FIG. 28 may be made variable and programmable either dynamically or statically.

It is possible to completely correct for this undesirable effect, for any one given listener position L, and approximately correct for a wide range of listener positions, by adding differential digital time delay to the signals to each transducer. FIG. 28 illustrates how this is achieved: −N unary signals from the encoder are fed in at the left each to a separate digital delay line 73 producing delays $t_1$, $t_2$, ... $t_N$, chosen such that: $-t_j=t_{MAX}-(D+d_j)/c$, where $t_{MAX}=(D+d_{MAX})/c$ and $d_{MAX}$ is the maximum value of $d_j$, and $t_j$ is the appropriate value of delay for transducer $T_j$ at distance $D+d_j$ from L. As the signals to each transducer are one-bit or unary digital signals, delay devices can be very simple (e.g. a 1 bit wide shift register, or suitably addressed RAM storage elements). The arrangement of the delays is such that the transducers closest to the listening position are delayed the most, and those furthest from it, the least, or not at all, so as to give the sound from the distant transducers a 'head-start'. In practice, the delay applied would be quantised to the nearest integral multiple of a suitable delay time (e.g. 5 μs, for maximum 10% error on a 20 KHz output signal). Thus a digital delay system with a 200 KHz clock and variable length real or synthesised shift registers in each transducer driver path would suffice. This could be integrated with the transducer drive electronics into an ASIC (Application Specific Integrated Circuit), and the actual pattern of delays required for a particular transducer and listener-geometry programmed into the driver chip. This program could even be varied to suit different listening positions during use of the loudspeaker. This is illustrated in FIG. 29 where the N unary coded inputs arrive at the left at 77 and are fed into N programmable variable digital delay generators 76 with delays $t_1$, $t_2$ ... to $t_N$, each digital delay being controlled by a signal from the digital delay program store 78 which receives program delay information from input 75. The outputs of the delay generators 76 eventually drive transducers 74 as shown schematically. The program delay information 75 can either be set up once before each use of the loudspeaker, or could alternatively be varied dynamically throughout the use of the speaker, and one application of this would be to track the listener's position relative to the loudspeaker and optimise the delay pattern $t_1$ to $t_N$ for his current position.

The digital nature of the output transducers allows a method of volume level control that ensures that maximum signal resolution and maximum signal-to-noise ratio is attained at all levels of listening, with particular advantages at low listening levels. With a conventional (analogue) hi-fi amplifier, the system volume control is usually placed somewhere before the main power amplifier in the input-to-output path of the system. The effect of this is that the power amplifier itself is always operating at the same power-level regime (i.e. always capable of full power output) and more importantly, always produces the same absolute level n of self-generated spurious output noise. When listening at high levels, where the peak output power p is approached then the perceived signal-noise-ratio (snr) of the amplifier is p/n. However, when listening at much reduced (and much more common domestic) listening levels, e.g. p/l where l might typically be 100 (e.g. a listening level of 1W electrical for a 100W electrical amplifier) then the perceived amplifier snr is (p/l)/n, i.e. the snr is reduced by the factor l. This can bring the amplifier self-noise levels into prominence in a hi-fi system. The DLS allows at least two methods of volume reduction in the amplifier itself, right at the power generation point, so that noise and signal are reduced together, thus maintaining the inherent snr of the DLS/amplifier combination.

Method 1 is to supply the output pulse amplifiers from a variable power supply level, so that smaller pulse amplitudes are produced when a lower volume setting is used. To implement such a scheme, the power supply output voltage would be made to depend in some way, on the volume level setting chosen. In this case, output power is proportional to the square of supply voltage, giving a wide power output range whilst keeping the supply level within operating limits of the pulse amplifiers.

Method 2 applies pulse-width control to the output transducer drivers, so that whereas normally the transducers would either be on or off for an entire digital clock cycle, by contrast with pulse width control, the transducers that were previously on for the whole of each digital clock cycle would all be gated off for a same proportion of each such cycle. If the proportion of a cycle gated off was x % then output power would be reduced to (100−x) %, so with this method control is proportional to $x^1$. However, apart from limitations caused by the finite rise and fall times of the transducer driver output pulse amplifiers, this method allows very wide range power level control, and may be implemented entirely digitally.

Finally, both Methods 1 and 2 could be used together if required to optimize their respective benefits.

The method described above for volume control and low-level listening noise reduction, can also be used to reduce the total number of transducers needed in a DLS without reducing the effective resolution of the sound output. The method works by dynamically applying the low-level listening technique as a function of the actual level of the input signal. Thus, when input signal amplitudes are small, the output power provided by each output transducer is reduced proportionately, and when the input signal approaches its maximum permitted value, the output transducers are arranged to provide their maximum power. For example, consider a system with 16-bit signed binary digital input, and only 1023 (=$2^{10}$−1) unary output transducers, corresponding to 11-bit signed binary signals. Then, if whenever the input signal magnitude was small enough that it could be expressed with 10 or less bits, we could connect the lowest 10 (excluding the sign bit) input bits to a 10-bit unipolar binary to unary encoder and drive all the output transducers from that, but each with output power reduced from full load to 1/64 (=$½^6$) of full power, then we could reproduce the low level signal with exactly the same output resolution as if we had 65535 (=$2^{16}$−1) transducers. For intermediate levels of input it is necessary to connect the 10-input bits of the encoder in the example to bits 1 to 10, then 2 to 11, etc up to 5 to 15 for the highest level of input signals.

In this way, input signals greater than 1/64 of maximum input level are always quantised to 10-bit precision right through to the output, and smaller signals to exactly the same precision as they would be with a full 16-bit DLS. The dynamic range of a 16-bit system and the precision of an 11-bit system are attained at much greater simplicity than with a full 16-bit system. The fact that a 16-bit CD digital system sounds adequately accurate even when reproducing music at levels very much lower than full amplitude indicates that the full 16-bit precision is not needed for adequate sound quality. It is necessary however for dynamic range. The scheme just described provides both of these features by effectively using a floating-point representation of the digital signal.

Figure 30:
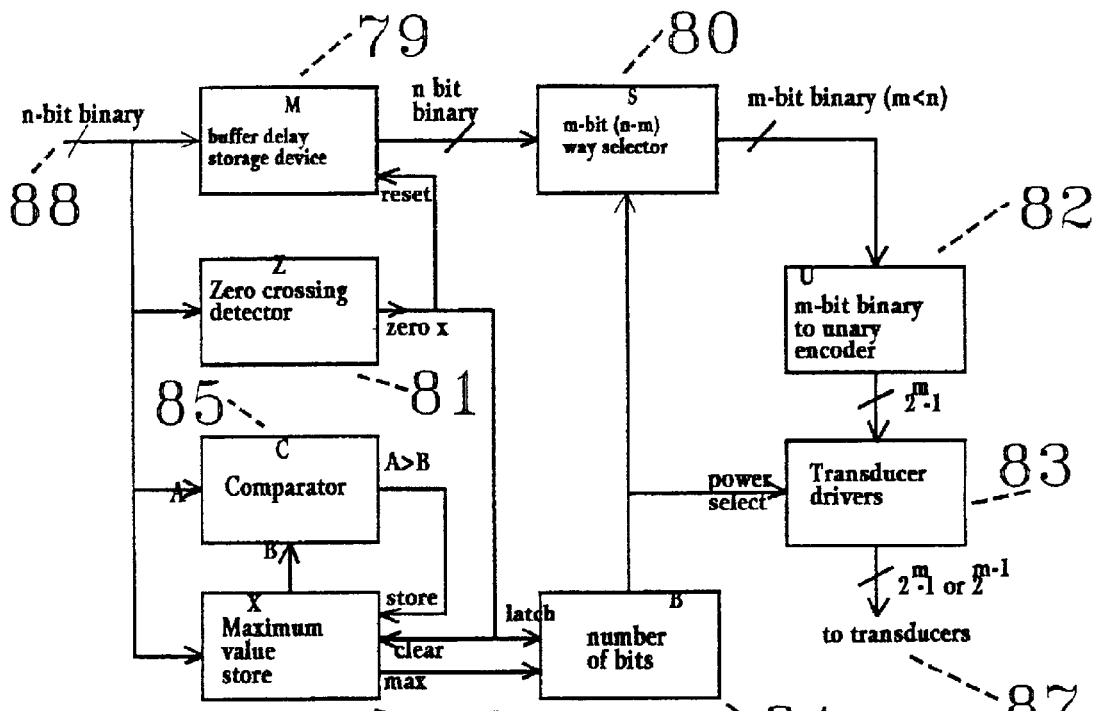
FIG. 30 illustrates in block diagram form a system to select the most significant non-zero bits of an input signal and apply them to a number of unary transducers so as to maintain the desired input-output relationship whilst maintaining the highest possible resolution.

FIG. 30 illustrates a possible method of implementing this scheme. Here an n-bit binary input signal 88 is to be reproduced with an m-bit digital loudspeaker where m<n. The n-bit input signal 88 is fed into a digital buffer memory M at 79 capable of storing at least one half-cycle of the input signal at its lowest frequency (e.g. 50 ms for a 20 Hz low frequency limit). It is simultaneously fed to a comparator C at 85 and maximum value storage latch X at 86, such that during the half cycle, successively greater input values become stored in the maximum value latch 86. A zero crossing detector Z at 81 provides a signal at the end of each input half cycle. At this point, the value in the maximum value latch 86 indicates how large is the biggest signal stored in the buffer 79, containing the digital input samples yet to be reproduced (as they have been buffered in 79 and thus delayed). During the next half cycle, these stored samples will be read out of 79 and reproduced by the loudspeaker whilst new values for the next half cycle are being stored. At the end of the half cycle, then, the value in 86 is latched into the number-of-bits register B at 84, which outputs an integer in the range 0 to n−m (where m<n as before). This number is used to select the power level to be used by the output transducer drivers 83 for the half cycle (which may be controlled by a pulse width modulation technique, or a supply voltage variation technique, or both in combination, as described previously). It is also used to select which of the unsigned input bits 0 to n−2 will be passed from the buffer 79 to the binary to unary encoder U at 82. This selection is done by an m-bit wide, n−m way selector block S at 80, which takes its digital signal input from buffer 79 (n bits wide) and sends m of those bits onto the unary encoder 82. Which bits it selects are determined by the signal from register 84. It always selects an adjacent group of bits, m bits wide, with the lowest output bit selected being in the range bit 0 to bit n−m, and the highest output bit selected being in the range m−1 to n−2, bit n−1 being the sign bit in this example.

Typical savings provided by this technique are: for a 16-bit audio digital signal and a 10-bit digital loudspeaker provided with the floating point bit representation system just discussed, the digital loudspeaker would require only 1023 transducers and drivers to reproduce sounds to 10 bit (unipolar) precision over a 16-bit dynamic range, as compared to a 16-bit DLS which would require 32767 transducers—i.e. a saving of over 31,000 transducers. Thus, this technique makes practicable the construction of unary-based digital loudspeakers with very high dynamic range and adequate precision, at relatively low cost.

Figure 31:
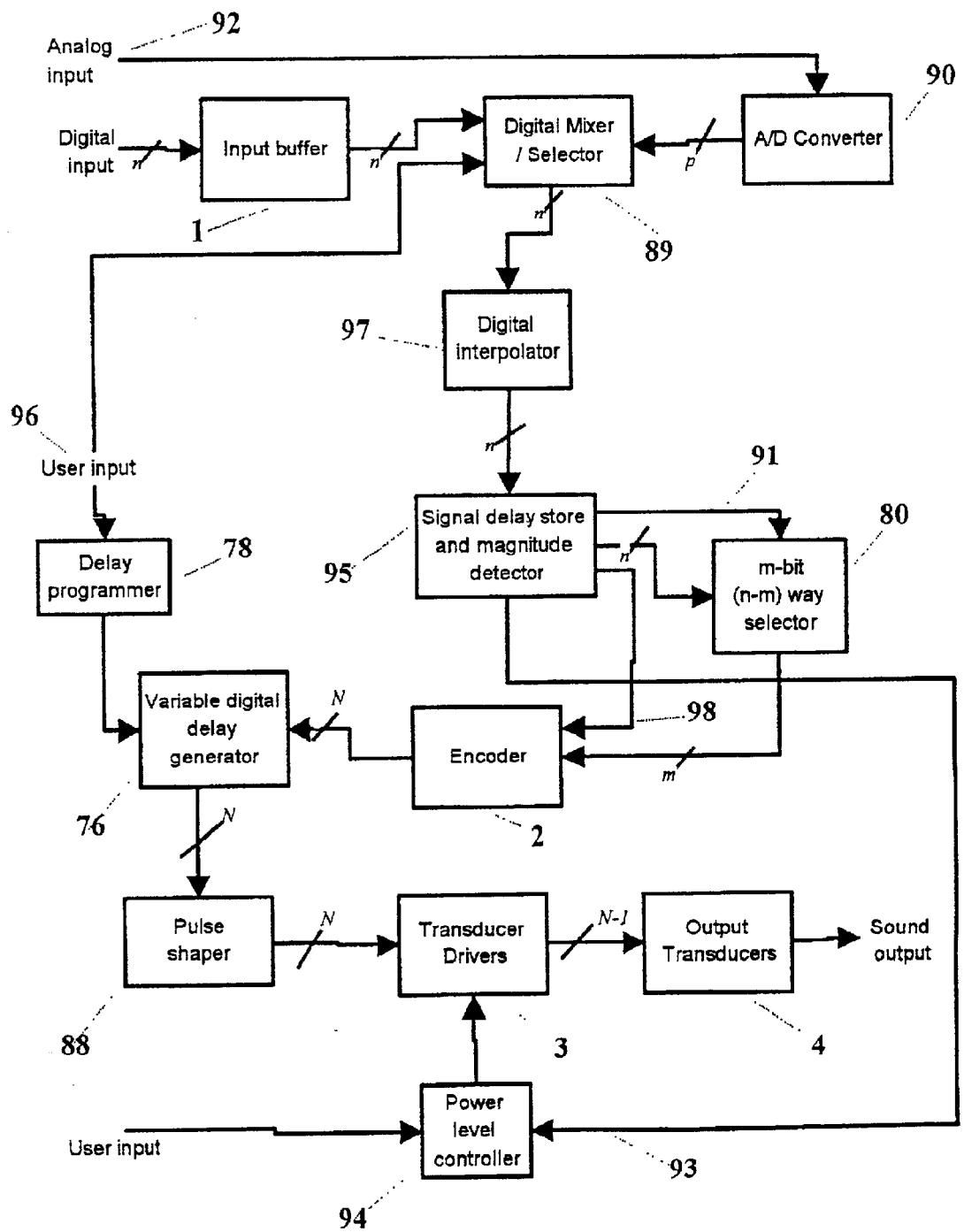
FIG. 31 illustrates in block diagram form a loudspeaker incorporating most of the inventions and designs described herein.

A specific embodiment of the invention incorporating many of the features described above will now be described by way of example with reference to FIG. 31 in which a digital input signal consisting of n binary bits is applied to input buffer 1, with an optional analogue input at 92 connected to analogue to digital converter 90, producing p binary output bits where p≦n, the outputs of the buffer 1 and converter 90 being connected to the inputs of digital selector/mixer 89, which is controlled by input from a user at 96. Depending on the user input some combination of input signals is sent in n-bit binary form from mixer 89 to a digital interpolator 97 where the effective sampling rate of the input signal is optionally increased before the n-bit data is passed to the signal delay store and magnitude detector 95 where the input signal is delayed for a time up to half the period of the lowest audio frequency to be reproduced, and where the peak magnitude of the delayed signal is determined whose value is used to produce control signals 91 and 93. The delayed n-bit binary signal data are then passed to an m-bit (n–m) way selector (where m≦n–1) controlled by signal 91, which emits m output binary (non-sign) bits connected to the input of binary-to-unary encoder 2. The sign bit is separately connected from delay store 95 directly to encoder 2 as shown at 98. The effect of store 95 and selector 80 are to select up to m bits plus sign of the n-bit input signal in such a way that the m most significant adjacent non-sign bits with a leading 1 are contained in the m-bit subset. Encoder 2 converts the m binary bits and sign bit into N unary signals where $N=2^{n-1}$ and where one of the N unary signals is a sign or polarity signal. The N unary signals are then fed to a variable length digital delay generator 76 controlled by delay programmer 78 whose mode of operation may be modified by the user at 96, where the differential delay of the various N unary signals may be adjusted to compensate for transducer 4 positions relative to listening position. The possibly delayed N unary signals then pass through pulse shaper 88 which may modify the square profile input pulses (not the sign signal) to different pulse shapes appropriate to the type of transducers 4 used, after which the N unary signals pass to the N–1 transducer drivers 3 which drive the N–1 transducers 4, the latter providing acoustic pulses which in combination constitute the output sound reproduced. The transducer drivers 4 are controlled by a signal from the power level controller 94 which in turn is controlled by an input from the magnitude detector in 95 and also by user input which may include volume level selection. The effect of this control signal on drivers 3 is to modify the mean output power delivered to each of the transducers 4 when activated by a pulse signal, in such a way that the mean power level from the array of transducers 4 may be varied, in the presence of a fixed level input signal.

Industrial Applicability

The digital loudspeaker has application in all instances where analogue loudspeakers are currently used, including reproduction of music and speech and other sounds in domestic and commercial equipment, including radios, televisions, record compact disc and tape players, music centres, hi-fidelity sound systems, public address systems, sound reinforcement systems, home theatres, cinemas, theatres, background music systems, bands, portable sound reproduction equipment, in-car entertainment systems, and in miniaturised form in headphones.

The advantages of this digital loudspeaker design over existing loudspeaker designs in these applications include: higher quality and lower distortion reproduction; flatter form factor than most cabinet-enclosed analogue loudspeakers; greater stability due to digital rather than analogue electronics; elimination of requirement for separate linear power amplifier from the sound reproduction system; lighter weight; greater portability; easier manufacture to consistent high quality standard; mass production techniques may be applied to the transducer array assemblies; higher efficiency and therefore lower power consumption and consequent longer operation time from battery power sources; scalable design allows balancing of required precision against cost and complexity in a uniform manner as lower distortion may be achieved simply by the addition of more components of identical precision; produces essentially zero output noise when input signal is zero (i.e. very high signal to noise ratio).

What is claim is:

1. A digital pulse-width-modulation (PWM) generator comprising:

an n bit digital magnitude comparator having first and second n bit inputs and an output indicative of the relative values of the signals applied at the first and second inputs;

a first n bit digital up/down counter having a count direction input coupled to receive a sign bit of a digital unary input signal, an n bit parallel binary count output connected to the first n bit input of the magnitude comparator, and a clock input;

a second n bit counter having a clock input coupled to receive a constant rate clock signal and an n bit parallel binary count output connected to the second n bit input of the magnitude comparator;

an AND gate having a first input coupled to receive the constant rate clock signal in frequency divided form and a second input coupled to receive a magnitude portion of the digital unary input signal, and further having an output connected to the clock input of the first counter; and wherein the comparator continually generates an output signal indicative of the relative magnitudes of the counts of the first and second counters, whereby said output signal is a PWM output signal with an average value representing a ramp voltage having a slope determined by magnitude portion of the digital unary input signal with a direction of a slope of the output signal being determined by the polarity of the sign bit.

2. A digital pulse-width-modulation (PWM) generator as claimed in claim 1, wherein the n bit parallel binary count output of the first n bit digital up/down counter is connected to the first n bit input of the magnitude comparator with a least significant bit (LSB) of the output connected to a LSB of the first input of the comparator and thereafter in bit significance sequence, and the n bit parallel binary count output of the second n bit counter is connected to the second n bit input of the magnitude comparator with a LSB of the output connected to a LSB of the second input of the comparator and thereafter in bit significance sequence.

3. A digital pulse-width-modulation (PWM) generator as claimed in claim 1 wherein the n bit parallel binary count output of the second n bit digital up/down counter is connected to the second n bit input of the magnitude comparator with a most significant bit (MSB) of the output connected to a LSB of the second input of the comparator and thereafter in reverse bit significance sequence, and the n bit parallel binary count output of the first n bit counter is connected to the first n bit input of the magnitude comparator with a LSB of the output connected to a LSB of the first input of the comparator and thereafter in bit significance sequence.

4. A digital pulse width modulation generator comprising an up/down digital counter, a digital magnitude comparator, and a second digital counter, wherein the magnitude comparator compares the relative sizes of the counts in the two counters connected to the magnitude comparator in the conventional sense with least significant bit outputs connected to least significant bit inputs of the comparator and thereafter in bit significance sequence, and whose greater-than or less-than outputs provide pulse width modulation signals, when the second counter is clocked continuously by a constant rate clock signal and when the up/down input of the up/down counter is controlled by the sign bit of the digital input signal and the clock input of the up/down counter is gated on and off by the presence or absence of the unary input signal, wherein the pulse width modulated output signal or signals convert a steady pulse on the unary input into a pulse width modulated ramp at the output, the slope of the ramp being determined by the polarity of the sign bit input.

5. A digital pulse width modulator as claimed in claim 4 except that the outputs of the second counter are connected to one of the input ports of the magnitude comparator in bit-reversed order that is in the reverse of the conventional ordering of bits and in particular with the least significant bit output of the counter connected to the most significant bit input of the comparator and vice versa, such that the pulse width modulated output from the comparator now makes many more transitions per total count cycle of the second counter whilst still maintaining the required average mark-:space ratio, thus easing the usually required low pass filtering of the pulse width modulated output.

6. A digital pulse width modulation generator for pulse width modulating a digital input signal comprising a single data bit and a sign bit, comprising:
   an up/down digital counter (46), the up/down input of the up/down counter (46) controlled by the sign bit of the digital input signal:
   an AND gate (45) having a first input which is clocked continuousy by a first clock signal, a second input which receives the data bit of the digital input signal, and an output connected to the clock input of the up/down counter (46);
   a second digital counter (42) clocked continuously by a constant rate, second clock signal;
   a digital magnitude comparator (43) which compares the outputs of the two counters (42, 46) so that the greater-than or less-than output of the magnitude comparator (43) provides a pulse width modulation output signal, whereby the value represented by the pulse width modulation output signal is a ramp when the data bit of the digital input signal is at logic one and is a static value when the data bit of the digital input signal is at logic zero, the slope of the ramp being detemined by the polarity of the sign bit of the digital input signal.

7. A digital pulse width modulation generator according to claim 6, wherein the outputs of the two counters (42, 46) are connected to the inputs of the magnitude comparator (43) with the bits of the outputs of the two counters (42, 46) connected to the bits of the inputs of the magnitude comparator (43) in bit significance sequence.

8. A digital pulse width modulation generator according to claim 6, wherein:
   the output of the up/down counter (46) is connected to an input of the magnitude comparator (43) with the bits of the output of the up/down digital counter (46) connected to the bits of the input of the magnitude comparator (43) with the bits in an order other than in bit significance sequence; and
   the output of the second counter (42) is connected to an input of the magnitude comparator (43) with the bits in an order other than in bit significance sequence.

9. A digital pulse width modulation generator according to claim 1, wherein:
   the output of the up/down counter (46) is connected to an input of the magnitude comparator (43) with the bits of the output of the up/down digital counter (46) connected to the bits of the input of the magnitude comparator (43) in bit significance sequence, and
   the output of the second counter (42) is connected to an input of the magnitude comparator (43) with the bits of the output of the second counter (42) connected to the bits of the input of the magnitude comparator (43) in reverse bit significance.

10. A digital pulse width modulation generator according to claim 6, wherein the up/down counter (46) is a dead-end counter.

11. A digital pulse width modulation generator according to claim 6, wherein the digital input signal is synchronized with said constant rate clock signal.

12. A digital pulse width modulaion generator according to claim 6, wherein the first clock signal is the second clock signal in frequency-divided form.

13. A digital pulse width modulation generator according to claim 6, wherein the first and second clock signals are derived from different clocks.

14. A digital pulse width modulation generator according to claim 6, wherein the up/down digital counter (46) has a reset input arranged to set the up/down digital counter (46) to half of the full count.

* * * * *